US011713964B1

(12) United States Patent
Goldovsky et al.

(10) Patent No.: US 11,713,964 B1
(45) Date of Patent: Aug. 1, 2023

(54) CATHODOLUMINESCENCE FOCAL SCANS TO CHARACTERIZE 3D NAND CH PROFILE

(71) Applicant: Applied Materials Israel Ltd., Rehovot (IL)

(72) Inventors: David Goldovsky, Dolev (IL); Ido Almog, Rehovot (IL); Ronny Barnea, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 29 days.

(21) Appl. No.: 17/574,055

(22) Filed: Jan. 12, 2022

(51) Int. Cl.
*G01B 15/04* (2006.01)
*H01J 37/285* (2006.01)
*H01J 37/244* (2006.01)
*H01J 37/28* (2006.01)

(52) U.S. Cl.
CPC ............ *G01B 15/04* (2013.01); *H01J 37/244* (2013.01); *H01J 37/28* (2013.01); *H01J 37/285* (2013.01)

(58) Field of Classification Search
CPC . G01B 15/04; H01J 37/00; H01J 37/02; H01J 37/244; H01J 37/28; H01J 37/26; H01J 37/285
USPC .......................... 250/282, 306, 307, 310, 311
See application file for complete search history.

(56) References Cited

U.S. PATENT DOCUMENTS

| | | | |
|---|---|---|---|
| 6,670,610 B2 | 12/2003 | Shemesh et al. | |
| 8,709,269 B2 | 4/2014 | Shemesh | |
| 9,535,014 B1 | 1/2017 | Feldman et al. | |
| 2019/0148108 A1* | 5/2019 | Sun | H01J 37/28 250/307 |
| 2019/0198288 A1* | 6/2019 | Maazouz | H01J 37/3056 |
| 2021/0066026 A1 | 3/2021 | Kris et al. | |
| 2021/0349019 A1 | 11/2021 | Kapoano et al. | |

* cited by examiner

*Primary Examiner* — Jason L McCormack
(74) *Attorney, Agent, or Firm* — Kilpatrick Townsend & Stockton LLP

(57) ABSTRACT

Disclosed herein is a system for profiling holes in non-opaque samples. The system includes: (i) an e-beam source configured to project an e-beam into an inspection hole in a sample, such that a wall of the inspection hole is struck and a localized electron cloud is produced; (ii) a light sensing infrastructure configured to sense cathodoluminescent light, generated by the electron cloud; and (iii) a computational module configured to analyze the measured signal to obtain the probed depth at which the wall was struck. A lateral offset, and/or orientation, of the e-beam is controllable, so as to allow generating localized electron clouds at each of a plurality of depths inside the inspection hole, and thereby obtain information at least about a two-dimensional geometry of the inspection hole.

20 Claims, 12 Drawing Sheets

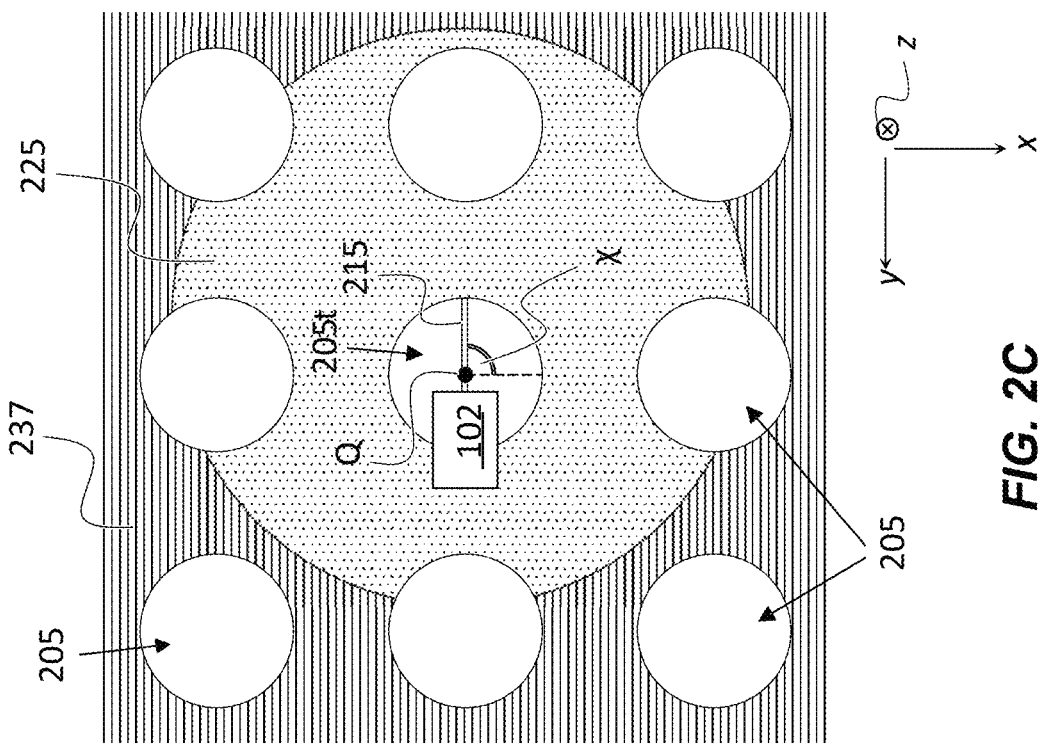
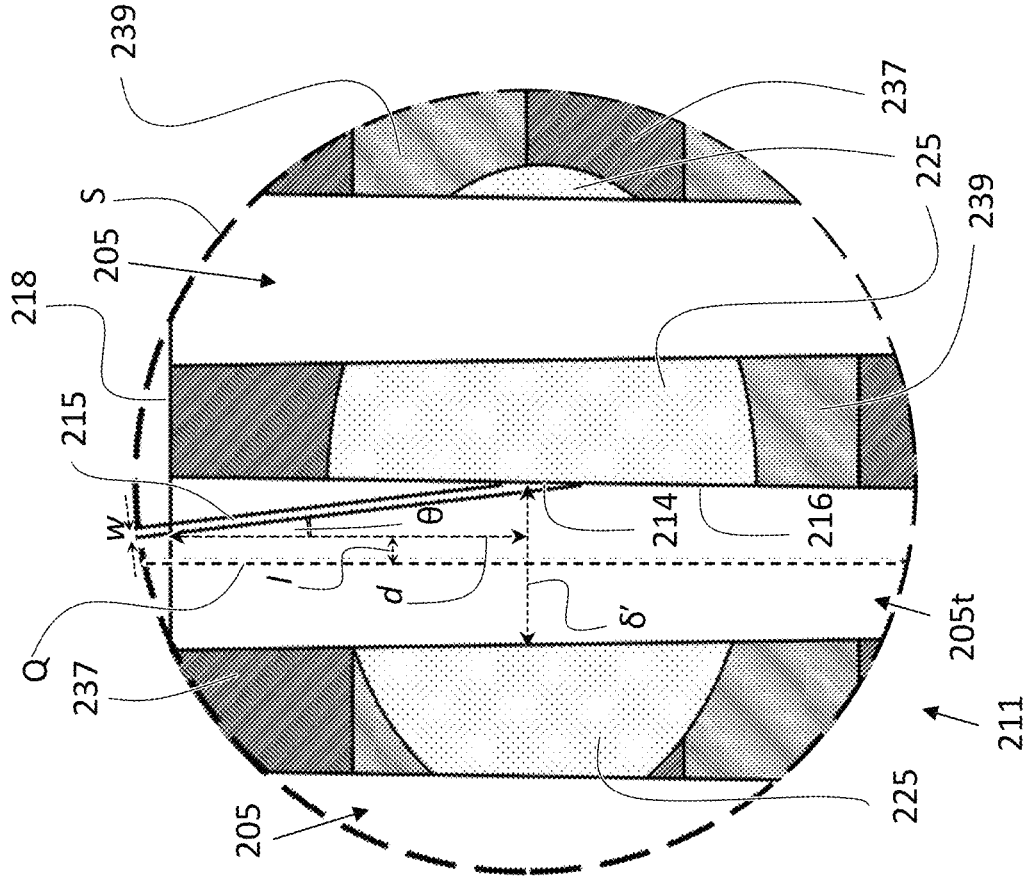
FIG. 2B
FIG. 2C

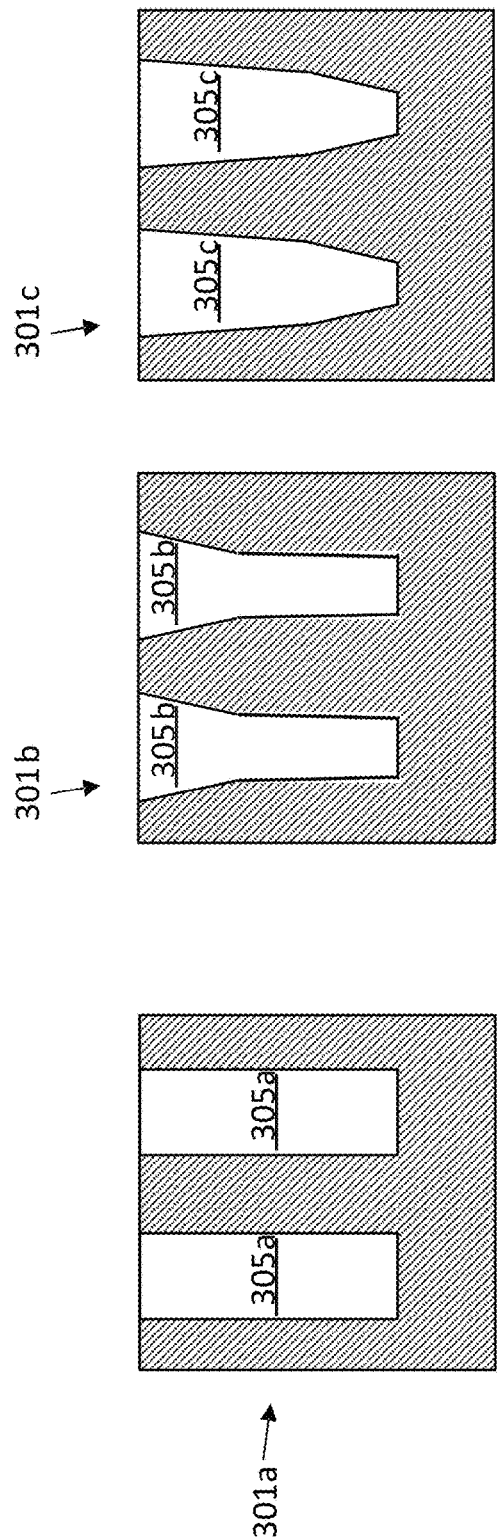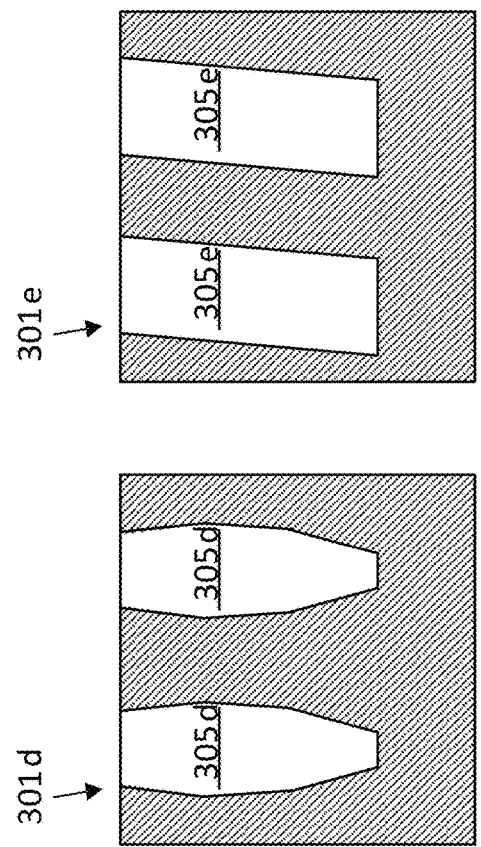

CATHODOLUMINESCENCE FOCAL SCANS TO CHARACTERIZE 3D NAND CH PROFILE

TECHNICAL FIELD

The present disclosure relates generally to non-destructive profiling of semiconductor structures.

BACKGROUND OF THE INVENTION

Present techniques for non-destructive three-dimensional profiling of semiconductor structures include optical-based techniques and scanning electron microscope-based techniques. Optical-based profiling of semiconductor structures (such as 3D NAND memory) is challenging due to difficulties in generating reliable localized events (i.e. individually addressing sufficiently small regions in the semiconductor structure). SEM-based profiling allows for the generation of reliable localized events but is nevertheless challenging since the number of secondary electrons escaping the semiconductor structure decreases very sharply with the probed depth.

BRIEF SUMMARY OF THE INVENTION

Aspects of the disclosure, according to some embodiments thereof, relate to non-destructive probing of channel holes in semiconductor structures. More specifically, but not exclusively, aspects of the disclosure, according to some embodiments thereof, relate to cathodoluminescence-based methods and systems for profiling vias in 3D NAND memory (vertical NAND stacks).

Thus, according to an aspect of some embodiments, there is provided a system for profiling holes in non-opaque samples. The system includes:
  An electron beam (e-beam) source configured to project an e-beam into an inspection hole (i.e. a hole which is to be profiled) in a sample, such that a wall of the inspection hole is impinged and a localized electron cloud is produced inside a bulk of the sample.
  A light sensing infrastructure including:
    An optical module configured to manipulate cathodoluminescent light, generated by the electron cloud, so as to allow obtaining from the transmitted light a probed depth d at which the wall of the inspection hole was impinged on by the e-beam.
    A light sensing module configured to obtain a measured signal of the transmitted light.
    A computational module configured to analyze the measured signal to obtain the probed depth d.
  A lateral offset, and/or orientation, of the e-beam is controllable, so as to allow generating localized electron clouds at each of a plurality of depths inside the sample, and thereby obtain information at least about a two-dimensional geometry of the inspection hole.

According to some embodiments of the system, the system is configured to controllably project the e-beam at a plurality of azimuthal angles. The plurality of azimuthal angles includes two azimuthal angles $\varphi 1$ and $\varphi 2$, which differ from one another by between about 150° and about 200°. The computational module may be configured to extrapolate a lateral extent of the inspection hole along a cross-section of the inspection hole, (the cross-section being) defined by $\varphi 1$ and $\varphi 2$, as a function of the probed depth d, based on the lateral offsets thereat (i.e. at the probed depth d) in the directions defined by $\varphi 1$ and $\varphi 2$.

According to some embodiments of the system, the cross-section bisects, or substantially bisects, the inspection hole, at an azimuth angle $\varphi$ perpendicular to, or substantially perpendicular to, $(\varphi 1+\varphi 2)/2$ (i.e. $\varphi+90°$ points (laterally and) midway, or substantially midway, between $\varphi 1$ and $\varphi 2$).

According to some embodiments of the system, the computational module is configured to analyze the measured signal taking into account an expected profile of the inspection hole.

According to some embodiments of the system, the computational module is configured to analyze the measured signal further taking into account reference data specifying expected values of the measured signals.

According to some embodiments of the system, the system further includes a controller functionally associated at least with the e-beam source and configured to set the lateral offset and the orientation of the e-beam.

According to some embodiments of the system, the optical module includes a focal scanning unit configured to filter the cathodoluminescent light along (e.g. progressively along) an interval on an optical axis of the focal scanning unit.

According to some embodiments of the system, the focal scanning unit includes:
  A focusing lens.
  A screen including an aperture, configured to filter light, arriving, thereat from the focusing lens.
  A collimating lens configured to collimate light, filtered by the screen, onto the light sensing module.
  A distance between the screen and the focusing lens is controllably adjustable.

According to some embodiments of the system, the light sensing module is a bucket detector.

According to some embodiments of the system, the optical module further includes a collimating mirror positioned and configured to collimate the cathodoluminescent light, generated by the electron cloud, and direct said light to the focal scanning unit.

According to some embodiments of the system, the optical module includes a focal mask. According to some such embodiments, the light sensing module includes a plurality of image sensors, and the computational module may be configured to compute the probed depth d based on positions of spots formed on each of the image sensors.

According to some embodiments of the system, the focal mask is a Hartmann mask.

According to some embodiments of the system, the focal mask is a Scheiner disc. According to some such embodiments, the light sensing module includes two image sensors, and the computational module may be configured to compute the probed depth d based on a distance between a first spot, formed on a first of the two image sensors, and a second spot, formed on a second of the two image sensors.

According to some embodiments of the system, the optical module includes a plurality of mirrors arranged so as to produce a plurality of spots, respectively, on the light sensing module. The probed depth d may be obtained based at least on one or more relative distances between pairs of spots from the plurality of spots.

According to some embodiments of the system, the plurality of mirrors includes at least two converging mirrors.

According to some embodiments of the system, the system is further configured to allow orienting the e-beams at a polar angle (as defined by in a spherical coordinate system) whose tangent is smaller than about $$\frac{1}{D} \cdot \left( \langle \delta \rangle - \frac{w}{2} \right),$$

thereby allowing to probe the inspection hole to a bottom thereof. D is a depth of the inspection hole, <δ> is an average diameter of the inspection hole, and w is a width of the e-beam.

According to some embodiments of the system, the lateral offset of the e-beam is varied at increments dependent on a spot size of the e-beam on the wall of the inspection hole. A minimum spot size may be dependent on the depth D or on a depth at which the inspection hole is probed by the e-beam.

According to some embodiments of the system, the system is further configured such that a relative azimuthal angle between the e-beam and a lateral axis of the inspection hole, is controllable, so as to allow generating localized electron clouds inside the inspection hole, at each of a plurality of relative azimuthal angles, and thereby obtain information about a three-dimensional geometry of the inspection hole.

According to some embodiments of the system, the system further includes a maneuverable stage, configured to have mounted thereon the sample. The maneuverable stage is rotatable, so as to allow probing the inspection hole at at least four azimuthal angles of 0°, 90°, 180°, and 270°.

According to some embodiments of the system, the sample is or includes a semiconductor structure.

According to some embodiments of the system, the semiconductor structure is a 3D NAND memory and holes in the sample, including the inspection hole, are vias.

According to some embodiments of the system, the vias are, up to manufacturing imperfections, slanted, bowed, and/or tapered.

According to some embodiments of the system, the e-beam source is configured to produce the e-beam such that an average landing energy of electrons in the e-beam is between about 1 keV and about 20 keV.

According to some embodiments of the system, the e-beam source is configured to produce the e-beam with a current density between about 0.5 nA and about 1.2 nA.

According to some embodiments of the system, the system further includes one or more additional sensors selected from a backscattering electron detector, a secondary electron detector, an X-ray detector, and an absorbed current detector. The computational module is configured to take into account measurement data, collected by the one or more additional sensors, in obtaining the probed depth d and/or the lateral extent of the inspection hole at the probed depth d.

According to an aspect of some embodiments, there is provided a cathodoluminescence-based method to probe holes in a non-opaque sample. The method includes:

An operation of obtaining a plurality of measured signals from an inspection hole (i.e. the hole being profiled) in a sample, which is non-opaque, by serially implementing sub-operations of:

Setting a respective lateral offset and/or a respective orientation of an electron beam (e-beam) relative to the inspection hole in the sample, Producing a localized electron cloud within the sample (i.e. inside a bulk of the sample) by impinging the e-beam on a wall of the inspection hole.

Sensing light generated, through cathodoluminescence, by the electron cloud, thereby obtaining a respective measured signal.

An operation of analyzing each of the plurality of measured signals to obtain: (i) per each measured signal (of the plurality of measured signals), a respective probed depth d within the inspection hole at which the wall was impinged (by the respective e-beam), and (ii) based at least on the probed depths, at least at least a two-dimensional profile of the inspection hole.

According to some embodiments of the method, the operation of obtaining the plurality of measured signals includes implementing the sub-operations thereof at a plurality of azimuthal angles. The plurality of azimuthal angles includes two azimuthal angles φ1 and φ2, which differ from one another by between about 150° and about 200°. The operation of analyzing each of the plurality of measured signals further includes extrapolating a lateral extent of the inspection hole along a cross-section of the inspection hole, defined by $\varphi_1$ and $\varphi_2$, as a function of the probed depth d, based on the lateral offsets thereat in the directions defined by $\varphi_1$ and $\varphi_2$.

According to some embodiments of the method, the cross-section bisects, or substantially bisects, the inspection hole, at an azimuth angle φ perpendicular to, or substantially perpendicular to, $(\varphi_1+\varphi_2)/2$.

According to some embodiments of the method, the measured signals are analyzed taking into account an expected profile of the inspection hole.

According to some embodiments of the method, the measured signals are analyzed further taking into account reference data specifying expected values of the measured signals.

According to some embodiments of the method, the lateral offsets and/or orientations of the e-beams are varied between implementations, such that the electron clouds are produced at a plurality of depths inside the inspection hole.

According to some embodiments of the method, at least some of the e-beams are oriented at a polar angle whose tangent is smaller than about $$\frac{1}{D} \cdot \left( \langle \delta \rangle - \frac{w}{2} \right),$$

thereby allowing to probe the inspection hole to a bottom thereof. D is a depth of the inspection hole, <δ> is an average diameter of the inspection hole, and w is a width of the e-beam.

According to some embodiments of the method, per each of the probed depths, in the operations of producing the localized electron clouds, the e-beams are directed at a plurality of azimuthal angles, respectively, such that information about a three-dimensional geometry of the inspection hole is obtained.

According to some embodiments of the method, in the operations of producing the localized electron clouds, the inspection hole is probed at at least four azimuthal angles of 0°, 90°, 180°, and 270°.

According to some embodiments of the method, the sample is or includes a semiconductor structure.

According to some embodiments of the method, the semiconductor structure is a 3D NAND memory and holes in the sample, including the inspection hole, are vias.

According to some embodiments of the method, the vias are, up to manufacturing imperfections, slanted, bowed, and/or tapered.

According to some embodiments of the method, an average landing energy of electrons in the e-beam is between about 1 keV and about 20 keV.

According to some embodiments of the method, a current density of the e-beam is between about 0.5 nA and about 1.2 nA.

According to some embodiments of the method, focal scanning is utilized to obtain the value of d.

According to some embodiments of the method, the method further includes, when reference data for the expected profile of the inspection hole is unavailable, and, optionally, the expected profile of the inspection hole is not known, an initial calibration operation. In the initial calibration operation the reference data is generated by: (a) serially implementing the operation of producing the localized electron cloud and the operation of sensing the generated light to obtain a plurality of measured signals, (b) slicing the sample and obtaining an actual structure of the inspection hole by utilizing a scanning and/or transmission electron microscope to profile each of the slices, and (c) correlating the obtained measured signals to the obtained actual structure.

According to some embodiments of the method, the lateral offset of the e-beam is varied at increments dependent on a spot size of the e-beam on the wall of the inspection hole. A minimum spot size may be dependent on the depth D or on a depth at which the inspection hole is probed by the e-beam.

According to some embodiments of the method, each implementation further includes sensing backscattered electrons and/or secondary electrons, generated by interaction of between the e-beam and the sample. The probed depth d, and/or the lateral extent of the inspection hole at the probed depth d, is obtained further taking into account measurement data of the backscattered electrons and/or the secondary electrons.

According to some embodiments of the method, each implementation further includes sensing X-rays, generated by interaction of between the e-beam and the sample. the probed depth d, and/or the lateral extent of the inspection hole at the probed depth d, is obtained further taking into account measurement data of X-rays.

According to an aspect of some embodiments, there is provided a computer-readable non-transitory storage medium storing instructions that cause a controller and a processing unit of a system for profiling holes in non-opaque samples, to:

Command an electron beam (e-beam) source of the system to serially project e-beams into an inspection hole (i.e. a hole which is to be profiled) in a sample, such that a wall of the inspection hole is impinged and localized electron clouds are produced at plurality of depths, respectively.

Analyze measured signals, obtained by sensing cathodoluminescent light, generated by the electron clouds, to derive respective probed depths at which the wall of the inspection hole was impinged by the respective e-beams, and, from the probed depths, estimate respective lateral extents of the hole at said depths, so as to obtain information at least about a two-dimensional geometry of the inspection hole.

Certain embodiments of the present disclosure may include some, all, or none of the above advantages. One or more other technical advantages may be readily apparent to those skilled in the art from the figures, descriptions, and claims included herein. Moreover, while specific advantages have been enumerated above, various embodiments may include all, some, or none of the enumerated advantages.

Unless otherwise defined, all technical and scientific terms used herein have the same meaning as commonly understood by one of ordinary skill in the art to which this disclosure pertains. In case of conflict, the patent specification, including definitions, governs. As used herein, the indefinite articles "a" and "an" mean "at least one" or "one or more" unless the context clearly dictates otherwise.

Unless specifically stated otherwise, as apparent from the disclosure, it is appreciated that, according to some embodiments, terms such as "processing", "computing", "calculating", "determining", "estimating", "assessing", "gauging", or the like, may refer to the action and/or processes of a computer or computing system, or similar electronic computing device, that manipulate and/or transform data, represented as physical (e.g. electronic) quantities within the computing system's registers and/or memories, into other data similarly represented as physical quantities within the computing system's memories, registers or other such information storage, transmission or display devices.

Embodiments of the present disclosure may include apparatuses for performing the operations herein. The apparatuses may be specially constructed for the desired purposes or may include a general-purpose computer(s) selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method(s). The desired structure(s) for a variety of these systems appear from the description below. In addition, embodiments of the present disclosure are not described with reference to any particular programming language. It will be appreciated that a variety of programming languages may be used to implement the teachings of the present disclosure as described herein.

Aspects of the disclosure may be described in the general context of computer-executable instructions, such as program modules, being executed by a computer. Generally, program modules include routines, programs, objects, components, data structures, and so forth, which perform particular tasks or implement particular abstract data types. Disclosed embodiments may also be practiced in distributed computing environments where tasks are performed by remote processing devices that are linked through a communications network. In a distributed computing environment, program modules may be located in both local and remote computer storage media including memory storage devices.

BRIEF DESCRIPTION OF THE DRAWINGS

Some embodiments of the disclosure are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the disclosure. For the sake of clarity, some objects depicted in the figures are not drawn to scale. Moreover, two different objects in the same figure may be drawn to different scales. In particular, the scale of some objects may be greatly exaggerated as compared to other objects in the same figure.

In the figures:

FIGS. 2A to 2C schematically depict probing of an inspection hole in a sample utilizing the system of FIG. 1, according to some embodiments;

FIGS. 3A to 3E schematically depict example hole profiles, which are typical of NAND memories, and which may be probed utilizing the system of FIG. 1, according to some embodiments;

FIGS. 9A to 10D present results of simulations demonstrating the utility of the disclosed systems and methods, according to some embodiments thereof.

DETAILED DESCRIPTION OF THE INVENTION

Figure 1:
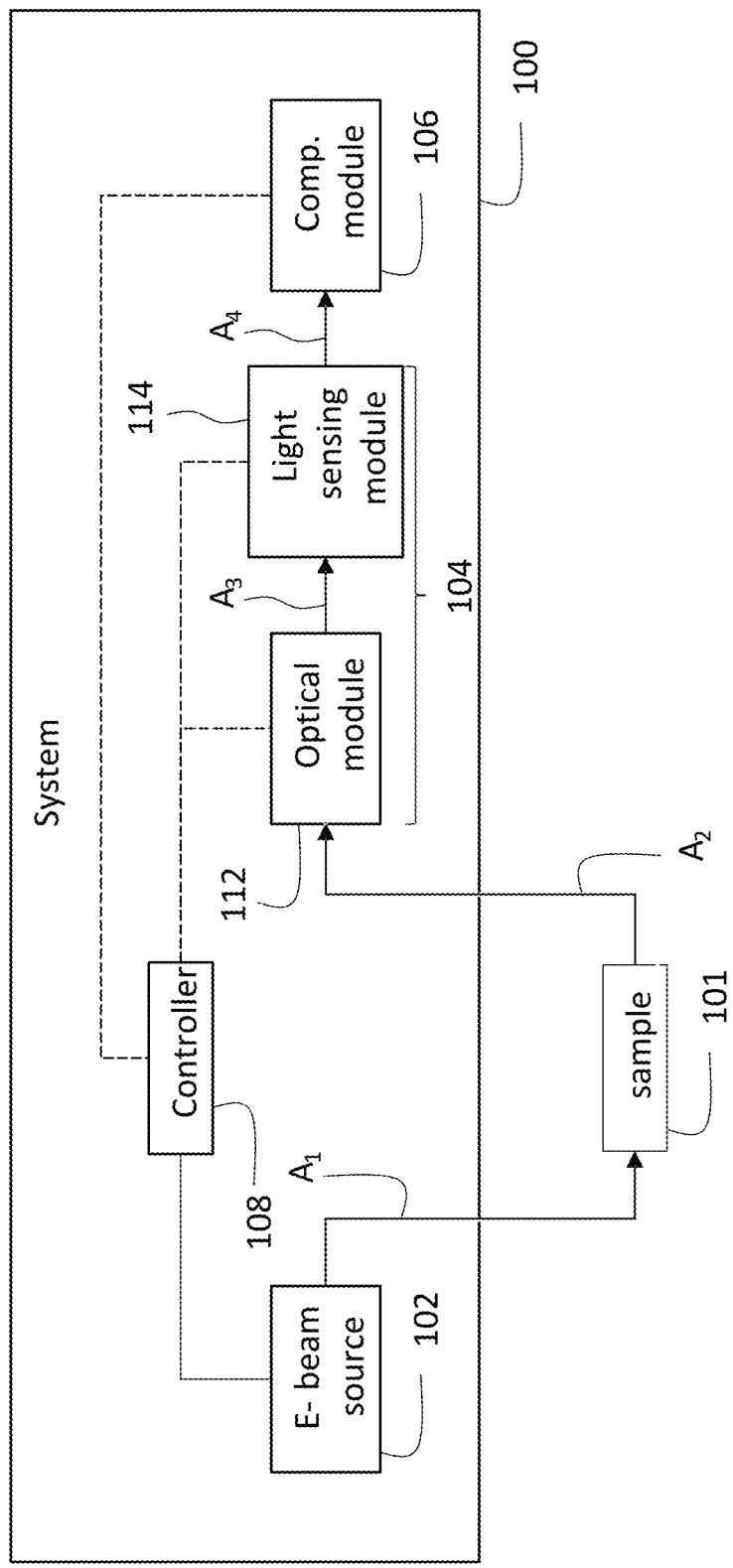
FIG. 1 is a block diagram of a system for profiling holes in non-opaque samples, according to some embodiments.

The principles, uses, and implementations of the teachings herein may be better understood with reference to the accompanying description and figures. Upon perusal of the description and figures present herein, one skilled in the art will be able to implement the teachings herein without undue effort or experimentation. In the figures, same reference numerals refer to same parts throughout.

In the description and claims of the application, the words "include" and "have", and forms thereof, are not limited to members in a list with which the words may be associated.

As used herein, the term "about" may be used to specify a value of a quantity or parameter (e.g. the length of an element) to within a continuous range of values in the neighborhood of (and including) a given (stated) value. According to some embodiments, "about" may specify the value of a parameter to be between 80% and 120% of the given value. For example, the statement "the length of the element is equal to about 1 m" is equivalent to the statement "the length of the element is between 0.8 m and 1.2 m". According to some embodiments, "about" may specify the value of a parameter to be between 90% and 110% of the given value. According to some embodiments, "about" may specify the value of a parameter to be between 95% and 105% of the given value.

As used herein, according to some embodiments, the terms "substantially" and "about" may be interchangeable.

For ease of description, in some of the figures a three-dimensional cartesian coordinate system (with orthogonal axes x, y, and z) is introduced. It is noted that the orientation of the coordinate system relative to a depicted object may vary from one figure to another. Further, the symbol ⊙ may be used to represent an axis pointing "out of the page", while the symbol ⊗ may be used to represent an axis pointing "into the page".

Referring to the figures, in block diagrams and flowcharts, optional elements and operations, respectively, may appear within boxes delineated by a dashed line. Further, in block diagrams, optional functional association and optional communicational association between elements may be delineated by a dashed line connecting the two elements.

The present application discloses a hybrid optical-SEM technique that combines advantages of optical and SEM based techniques, while overcoming, or at least mitigating, the challenges associated with each of the techniques. In particular, the disclosed systems and methods allow non-destructive (full depth) profiling of individual vias in 3D NAND memories. This stands in contrast to commonly employed non-destructive systems and methods, whose profiling of a target (single) via is limited to characterization in terms of mean properties of a plurality of vias (including the target via).

Systems

According to an aspect of some embodiments, there is provided a system for profiling holes in non-opaque samples. FIG. 1 is a block diagram of such a system, a system 100, and a non-opaque sample 101 probed thereby, according to some embodiments. Sample 101 may include at least one open-ended hole whose shape is to be profiled, in full or in part, using system 100. According to some embodiments, sample 101 may be or include a semiconductor specimen. According to some such embodiments, sample 101 is a 3D NAND memory and holes (not shown in FIG. 1) of sample 101 are constituted by vias (channel holes) of the 3D NAND memory. (It is to be understood that sample 101 is not included in system 100.)

Figure 2A:
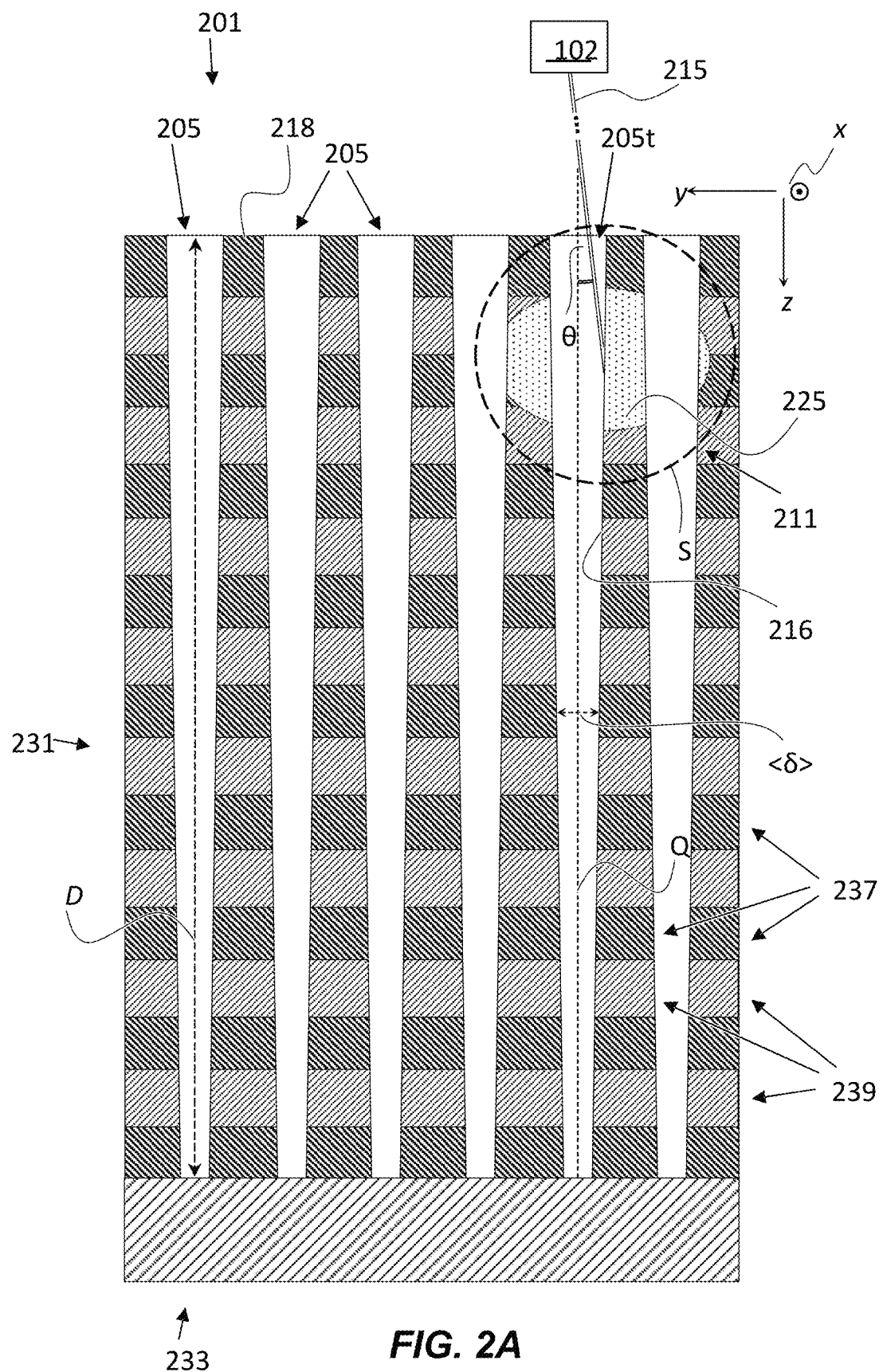

According to some embodiments, and as depicted in FIG. 1, system 100 includes an electron beam (e-beam) source 102, a light sensing infrastructure 104, a computational module 106, and a controller 108. E-beam source 102, light sensing infrastructure 104, and computational module 106 are functionally associated with controller 108. E-beam source 102 may be configured to generate an e-beam (represented by a first arrow $A_1$) that is directed into an inspection hole (i.e. a hole which is to be inspected in order to obtain a profile thereof; not shown) in sample 101, such as to impinge on a location (area) on a wall (inner surface) of the inspection hole. The intensity of the e-beam is selected to induce the formation of an electron cloud (as shown in FIGS. 2A and 2B) about the location impinged on (by the e-beam) within the bulk of the sample (e.g. when the sample is a semiconductor specimen, inside semiconductor material forming the sample). According to some embodiments, and as described in detail below in the description of FIGS. 2A-2C, a lateral offset, and/or orientation, of the e-beam, may be selected by controller 108. Consequently, e-beam source 102 may be utilized to generate localized electron clouds (one at a time) at a plurality of depths inside the inspection hole.

Light sensing infrastructure 104 may include an optical (transmission) module 112 and a light sensing module 114 (i.e. one or more light sensors or image sensors). Optical module 112 may be configured to selectively transmit to (e.g. filter therethrough onto) light sensing module 114 cathodoluminescent light (represented by a second arrow $A_2$), generated by the electron cloud, such that a probed depth—i.e. the depth at which the e-beam impinges on the wall of the inspection hole—may be obtained through a suitable measurement of the transmitted light and subsequent processing of the obtained measurement data. According to some embodiments, described below, the selective transmission may be effected using a focal scanning tool or a focal mask.

At least part of the transmitted light (represented by a third arrow $A_3$) travels from optical module 112 to light sensing module 114. According to some embodiments, light sensing module 114 may be configured to measure at least the power of the transmitted light and relay the measurement data (represented by a fourth arrow $A_4$), directly or via controller 108, to computational module 106. According to some embodiments, light sensing module 114 may be configured to measure other parameters of the transmitted light, in addition to, or instead off, the power thereof, as described, by way of non-limiting examples, in the descriptions of FIGS. 5 and 6. According to some embodiments, light sensing module 114 may be configured to sense an image formed by the transmitted light, or a signal produced thereby, and relay the measurement data, directly or via controller 108, to computational module 106.

Figure 4:
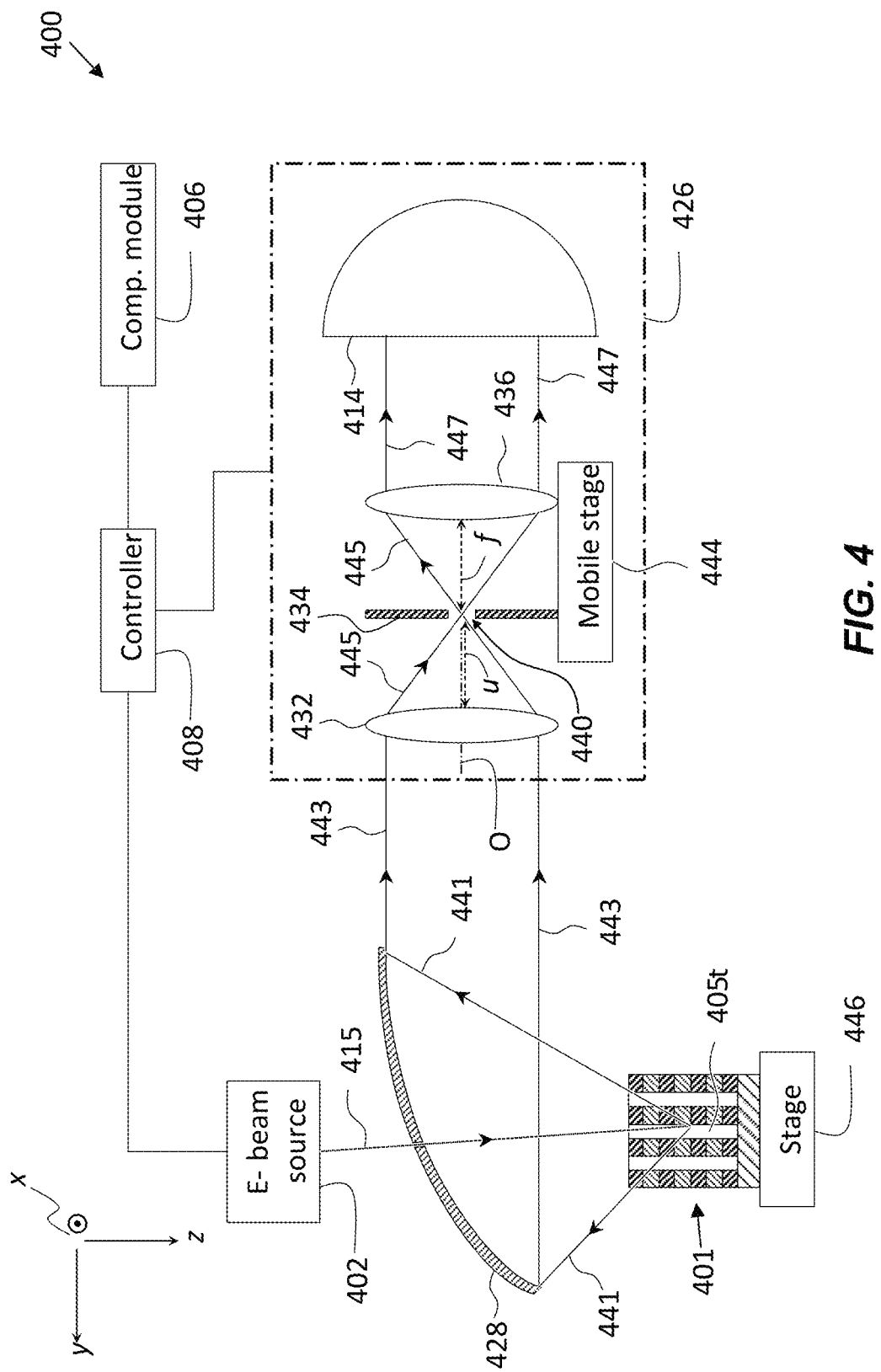
FIG. 4 schematically depicts a system for profiling holes in non-opaque samples and a sample probed by the system, the system corresponds to specific embodiments of the system of FIG. 1, which include a focal scanning unit.

Controller 108 is configured to control and synchronize operations of each e-beam source 102, light sensing module 104 (when including non-passive components as is the case with some specific embodiments of light sensing module 104 described in the description of FIG. 4). According to some embodiments, wherein sample 101 is positioned on a movable and/or rotatable stage (such as the stage of FIG. 4. according to some embodiments thereof; not shown in FIG. 1), controller 108 may further be configured to control operation of the stage.

According to some embodiments, computational module 106 and controller 108 may be housed in a common housing, for example, when implemented by a single computer.

E-beam source 102 and sample 101 may be housed in a vacuum chamber (not shown). According to some embodiments, light sensing module 114 (and optical module 112) may also be housed in the vacuum chamber. Alternatively, according to some other embodiments, light sensing module 114 may be positioned outside the vacuum chamber. In which case, optical module 112 may include components configured to direct the cathodoluminescent light to outside the vacuum chamber. According to some such embodiments, wherein light sensing infrastructure 104 includes a focal scanning unit (such as the focal scanning unit of FIG. 4), the focal scanning unit may be positioned outside the vacuum chamber.

Figure 2D:
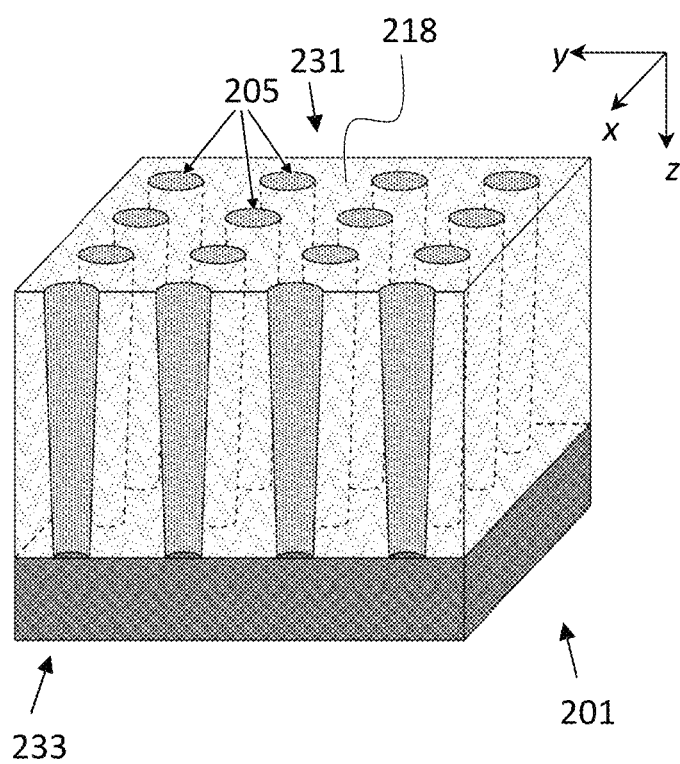
FIG. 2D presents a schematic perspective view of the sample of FIG. 2A, according to some embodiments.

Referring also to FIGS. 2A-2D, FIG. 2A presents a schematic, cutaway view of a non-opaque sample 201 probed by system 100, according to some embodiments. Sample 201 corresponds to specific embodiments of sample 101. Sample 201 includes a plurality of holes 205 (not all of which are numbered) arranged in an array, as can be seen in FIG. 2D, which presents a perspective view of sample 201. In FIG. 2D, sample 201 is depicted with a front part thereof removed (cut off) to better reveal the internal structure of sample 201.

In FIG. 2A, one of holes 205, an inspection hole 205$t$, is shown while undergoing profiling: E-beam source 102 is shown projecting an e-beam 215 into inspection hole 205$t$. E-beam 215 impinges on a location 214 (indicated in FIG. 2B) on a wall 216 (inner surface) of inspection hole 205$t$ and forms an electron cloud 225 within the bulk of sample 201 in the vicinity of the impinged location (i.e. location 214). According to some embodiments, and as depicted in FIGS. 2A-2C, a characteristic width of electron cloud 225 (e.g. a diameter of the electron cloud when the electron cloud is substantially spherical or ellipsoidal) may be greater than the distance between centers of adjacent holes. In such embodiments, the electron cloud may be formed around a plurality of holes (while being centered, or substantially centered, about location 214). The number of holes extending through the electron cloud depends on the (average) landing energy of the electrons in the e-beam. Nevertheless, as shown in the Results of simulations subsection, the cathodoluminescent light, generated by the electron cloud, conveys information from which the probed depth may be deduced (computed).

According to some embodiments, system 100 may be configured to scan rows of holes (i.e. probe each hole in each of the rows), with each row being scanned twice in opposite directions (e.g. in a first direction, defined by the positive y-axis, and next in a second direction, defined by the negative y-axis). Thus, for example, if a row of holes is scanned from right to left (i.e. in the direction of the positive y-axis per the coordinate system specified in FIGS. 2A-2D)—with the e-beam directed at an azimuthal angle φ of 270°, as depicted in FIGS. 2A and 2C (the angle χ=360°−φ is indicated in FIG. 2C)— then as a hole in the row is being scanned, the right wall of the hole is probed at increasingly greater depths (as sample 201 is translated to the right and/or e-beam source 102 is translated to the left). It is noted that by probing a hole in opposite directions, a two-dimensional profile of the hole on a vertical cross-section, which bisects, or substantially bisects, the hole, and which is parallel to the opposite probing directions and the depth direction (e.g. parallel to the y and z axes), may be obtained. According to some embodiments, system 100 may be configured to scan rows of holes in a raster scan pattern.

According to some embodiments, system 100 may be further configured to scan columns of holes, with each column being scanned twice in opposite directions. It is noted that by probing a hole in two pairs of opposite directions (such that the second pair of opposite directions is not parallel to the first pair of opposite directions, e.g. along the directions defined by the positive and negative x axes and the positive and negative y axes), a three-dimensional profile of the hole may be obtained. According to some embodiments, system 100 may be configured to scan columns of holes in a raster scan pattern.

A circular dashed line S is used to indicate the boundary of a region 211 of sample 201. FIG. 2B is an enlarged view of region 211. The region includes the location impinged on by e-beam 215. FIG. 2C presents a schematic, top view of sample 201 (while being probed by system 100), according to some embodiments. Shown is a top surface 218 of sample 201. To facilitate the description, a longitudinal axis Q is illustrated in FIGS. 2A-2C. The axis Q extends centrally along the length of inspection hole 205$t$ (so that when inspection hole 205$t$ defines a (non-tilted) truncated cone, the axis Q will constitute the symmetry axis of the truncated cone). A lateral offset of e-beam 215 relative to inspection hole 205$t$ may be defined as a distance l (indicated in FIG. 2B) between e-beam 215 and the axis Q at the entrance to the hole. That is, the distance l is measured along a plane parallel to the xy-plane (per the coordinate system shown in FIG. 2A), which coincides, or substantially coincides, with the entrance to the hole (i.e. with top surface 218 when top surface 218 is flat). E-beam 215 is oriented at a (polar) angle θ (indicated in FIG. 2C) relative to the z-axis (with which the Q axis coincides when the hole is not slanted).

According to some embodiments, the lateral offset l may be controllably varied by translating sample 201 relative to e-beam source 102, by translating e-beam source 102 relative to sample 201, or by a combination of the two. According to some embodiments, wherein sample 201 is translatable, sample 201 may be mounted on a maneuverable stage, such as, for example, the stage depicted in FIG. 4. According to some embodiments, for example, embodiments wherein a bottom region of the inspection hole is to be profiled or also profiled, the polar angle θ (also referred to as the "tilt angle" of the e-beam) is selected such that tan(θ) is smaller than about $$\frac{1}{D} \cdot \left( \langle \delta \rangle - \frac{w}{2} \right).$$

D is the depth of the inspection hole (the vertical distance from the entrance to the inspection hole to the bottom of the inspection hole), $\langle \delta \rangle$ (indicated in FIG. 2A) is an average lateral extent of the inspection hole (over the length thereof), δ' (indicated in FIG. 2B) is the lateral extent of inspection hole at substantially the probe depth, and w (indicated in FIG. 2B) is the width (diameter) of the e-beam at about the entrance to the inspection hole.

Additionally, or alternatively, according to some embodiments, an inspection hole may be probed at a plurality of depths by varying (i.e. changing) the polar angle at which the e-beam (e.g. e-beam 215) is projected.

The lateral offset of the e-beam may be varied in increments, which depend on a spot size of the e-beam on the wall of the inspection hole (i.e. the size of the location impinged on by the e-beam), such that a required precision (resolution of the profiling) is attained. The smaller the increments, the greater the resolution of the profiling. The minimum spot size depends (at least) on the initial beam diameter and divergence of the e-beam, the tilt angle θ of the e-beam, the energy and current density of the e-beam, as well as any slanting, if present, of the inspection hole. The tilt angle, in turn, is limited by the probed depth d. In this regard it is noted that if the same tilt angle θ is used throughout the profiling of the inspection hole, in order to ensure that the e-beam is not cut (partially blocked) at the entrance to the inspection hole, θ should be smaller than about $\langle \delta \rangle/(2D)$. More generally, θ may be almost as large as $\langle \delta \rangle/D$. ($\langle \delta \rangle/D$ is the aspect ratio of the inspection hole.)

According to some embodiments, system 100 may be configured such that a relative azimuthal angle of the e-beam, i.e. the azimuthal angle between the e-beam and a lateral direction defined by the sample (e.g. the direction defined by the rows of holes), is controllable, so as to allow generating localized electron clouds at a plurality of relative azimuthal angles inside the inspection hole, and thereby allow obtaining information about a three-dimensional geometry of the inspection hole.

According to some embodiments, the relative azimuthal angle may be varied by rotating a stage (such as the stage of the system depicted in FIG. 4) on which the sample is mounted. According to some embodiments, the stage may be rotated by 90°, 180°, and 270° (or −90°). According to some such embodiments, the above choice of relative azimuthal angles may suffice to three-dimensionally profile a tested hole to a required precision. Additionally, or alternatively, according to some embodiments, e-beam source 102 may be configured to generate e-beams at a plurality of controllably selectable azimuthal angles, thereby allowing to controllably vary the relative azimuthal angle.

According to some embodiments, e-beam source 102 is configured to produce e-beams each having a controllably selectable (average) landing energy in a range of between about 1 keV and about 20 keV. According to some embodiments, e-beam source 102 is configured to produce e-beams each having a controllably selectable current density in a range of between about 0.5 nA and about 1.2 nA. Computational module 106 is configured to analyze the measurement data to obtain the probed depth (i.e. the depth at which the e-beam strikes the wall of the inspection hole) and a lateral extent of the hole (e.g. the diameter of the hole when circular) at the probed depth (and at the relative azimuthal angle at which e-beam 215 is projected), as described below.

More specifically, computational module 106 may include computer hardware (one or more processors, and volatile as well as non-volatile memory components; not shown). According to some embodiments, computational module 106 may have stored therein software configured to receive as input measurement data, obtained by light sensing module 114, and (selected) adjustable settings and parameters of system 100 and, based thereon, output the probed depth and the lateral extent of the inspection hole at the probed depth and orientation (i.e. the relative azimuthal angle). Relevant adjustable settings of system 100 include at least the lateral offset and the relative azimuthal angle, as well as selectable settings of optical module 112 (for example, according to some embodiments, the distance between a focusing lens and a low-pass wavelength filter, when the optical module is a focal scanning unit). Additional adjustable settings may include the (average) landing energy of electrons in an e-beam and/or the current density of the e-beam. According to some embodiments, computational module 106 may be configured to output the probed depth, and the lateral extent of the inspection hole at the probed depth and orientation, additionally taking into account the expected profile of the inspection hole (i.e. the intended shape and dimensions thereof, or, put differently, the shape and dimensions that would be obtained if the manufacturing process of the sample, as well as the measurement equipment, were perfect). Ways whereby such software may be generated are described in the Methods subsection.

According to some embodiments, measurement data may first be processed to obtain a set of pairs of values $\{l_\varphi, d\}$ that specify the deduced (computed) probed depth per each value of the lateral offset. The subscript φ in $l_\varphi$ serves denotes the orientation along which the lateral offset was varied. A functional relationship $l_\varphi(d)$ may be extrapolated (or interpolated) from the set $\{l_\varphi, d\}$. When a hole is probed along two orientations (e.g. opposite orientations), two sets of pairs of values are obtained $\{l_1, d\}$ and $\{l_2, d\}$, wherein the subscripts serve to denote a first orientation and a second orientation. Computational module 106 may be configured to relate—when the two orientations are opposite—the lateral extent δ to the probed depth d via, for example, the relation $\delta(d) = l_1(d) + l_2(d) + \tan(\theta) \cdot d$.

According to some embodiments, to three-dimensionally profile an inspection hole, the inspection hole may be probed in at least three orientations (e.g. at relative azimuthal angles of 0°, about 120°, and about 240°). According to some embodiments, to three-dimensionally profile an inspection hole, the inspection hole may be probed in four orientations (e.g. at relative azimuthal angles of 0°, about 90°, about 180°, and about 270°). Computational module 106 may have stored in the memory thereof software configured to interpolate the three-dimensional profile of an inspection hole from the computed probed depths at a plurality of (i.e. at least three) orientations.

According to some embodiments, sample 201 may be a NAND memory. That is, sample 201 may include a semiconductor structure 231 mounted on a base portion 233. Semiconductor structure 231 includes holes 205 and may be composed of alternately disposed layers of two different semiconductor materials. As a non-liming example, semiconductor structure 231 may include alternately disposed silicon oxide ($SiO_2$) layers 237 and silicon nitride (e.g. $Si_3N_4$) layers 239. Base portion 233 may be constituted by a silicon substrate.

While the sample depicted in FIGS. 2A-2D includes holes shaped as truncated cones (whose diameter decreases as the depth is increased), it is to be understood that system 100 is not limited to probing such hole geometries (i.e. profiles) and other hole geometries may be probed thereby.

FIG. 3A presents a cross-sectional view of an "ideal" sample 301a, including straight holes 305a. That is, a diameter of holes 305a within sample 301a is constant (i.e. does not depend on the depth). Sample 301a is said to be ideal in the sense that vias are typically fabricated to be straight. In other words, in the absence of manufacturing imperfections, the vias would be straight. Several deviations from the straight hole geometry, which are typical vias of 3D NAND memoires, and which may be profiled utilizing system 100, are shown in FIGS. 3B-3E.

Referring to FIG. 3B, a cross-sectional view of a sample 301b, including tapering holes 305b, is shown. A diameter of holes 305b decreases with the depth at a first rate, for depths smaller than a threshold depth, and at a second rate, for depths greater than the threshold depth. The first rate is greater than the second rate. Referring to FIG. 3C, a cross-sectional view of a sample 301c, including tapered holes 305c, is shown. A diameter of holes 305c decreases with the depth at a first rate, for depths smaller than a threshold depth, and at a second rate for depths greater than the threshold depth. The first rate is smaller than the second rate. Referring to FIG. 3D, a cross-sectional view of a sample 301d, including bowed holes 305d, is shown. A diameter of holes 305d increases with the depth at a first rate, for depths smaller than a first threshold depth, decreases with the depth at a second rate, for depths greater than the first threshold depth and smaller than a second threshold depth, and decreases with the depth at a third rate, for depths greater than the second threshold depth. The second rate is smaller than the third rate. Referring to FIG. 3E, a cross-sectional view of a sample 301e, including slanted holes 305e, is shown.

As used herein, a hole may be said to be "slanted" when a longitudinal axis, extending along the length of a hole in a sample, is not perpendicular to the top surface of the sample (nor to the surface of the base portion), defining instead a small non-vanishing angle with respect to the normal to the top surface.

FIG. 4 is a block diagram of a system 400 for profiling holes in non-opaque samples, such as a sample 401, according to some embodiments. System 400 corresponds to specific embodiments of system 100, which include a focal scanning unit. Sample 401 corresponds to specific embodiments of sample 101. (It is to be understood that sample 401 is not included in system 400.) More specifically, system 400 may include an e-beam source 402, a computational module 406, and a controller 408, which are specific embodiments of e-beam source 102, computational module 106, and controller 108, respectively. An e-beam 415, generated by e-beam source 402, is shown impinging on a wall of an inspection hole 405t in sample 401. The impinging of e-beam 415 on the wall of inspection hole 405t leads to the formation of a localized electron cloud (not shown)—within the bulk of sample 401—centered about a location (area) on the wall whereat e-beam 415 is incident.

System 400 further includes a focal scanning unit 426 and, according to some embodiments, also a collimating mirror 428. According to some embodiments, focal scanning unit 426 includes a focusing lens 432, an apertured screen 434 (or, more generally, a low-pass wavelength filter), a collimating lens 436, and a bucket detector 414. Bucket detector 414 may correspond to specific embodiments of light sensing module 114 of system 100. Screen 434 is positioned between focusing lens 432 and collimating lens 436. Collimating lens 436 may be positioned between screen 434 and bucket detector 414. According to some embodiments, screen 434 includes an aperture 440 (i.e. a slit) that may be positioned along an optical axis O (indicated by a dashed-double-dotted line) of focusing lens 432 and/or an optical axis of collimating lens 436. That is, the optical axis of focusing lens 432 and/or the optical axis of collimating lens 436 may extend through aperture 440. According to some embodiments, screen 434 may be mounted perpendicularly to the optical axis of focusing lens 432 and/or the optical axis of collimating lens 436. According to some embodiments, the optical axes of focusing lens 432 and collimating lens 436 may overlap, or substantially overlap.

Collimating mirror 428 is configured to collimate cathodoluminescent light (indicated by light rays 441; only two of which are shown), generated by the electron cloud and arriving at collimating mirror 428, and direct the collimated light (indicated by light rays 443) towards focal scanning unit 426. Focusing lens 432 is configured to focus the collimated light, arriving thereat, towards aperture 440 on screen 434 (as indicated by light rays 445). Collimating lens 436 is configured to focus light filtered through aperture 440, such as to form a collimated, or substantially collimated, light beam (indicted by light rays 447). According to some embodiments, and as depicted in FIG. 4, collimating lens 436 may be positioned at a distance from screen 434 equal to the focal length f of collimating lens 436. Bucket detector 414 is configured to sense the light beam (focused by collimating lens 436).

According to some embodiments, a distance u between focusing lens 432 and screen 434 may be controllably adjustable. More specifically, a maximum power (peak power) signal is registered (obtained) by bucket detector 414 when the distance between focusing lens 432 and screen 434 is such that light rays 445 are focused (i.e. intersect), or substantially focused, at aperture 440. From said distance, labeled as $u_p$, the probed depth—i.e. the depth at which e-beam 415 is incident on the wall of inspection hole 405t—may be deduced. Thus, by controllably varying the distance between focusing lens 432 and screen 434 until maximum power is identified, the probed depth may be obtained.

According to some embodiments, screen 434 and collimating lens 436 may be jointly movable (such that the distance between screen 434 and collimating lens 436 is maintained) along the optical axis of focusing lens 432. According to some such embodiments, and as depicted in FIG. 4, screen 434 and collimating lens 436 may be mounted on a mobile stage 444, which is configured to be controllably translatable along the optical axis of focusing lens 432. Additionally, or alternatively, according to some embodiments, focusing lens 432 may be movable in parallel to the optical axis thereof.

The translation of mobile stage 444 may be controlled by controller 408. Bucket detector 414 may be configured to send to controller 408 power values measured thereby (i.e. values of the power of the filtered light arriving at bucket detector 414). Controller 408 may be configured to translate mobile stage 444 until peak power is identified.

Computational module 406 may be configured to estimate the probed depth d, based on the distance $u=u_p$, between focusing lens 432 and screen 434, at which the maximum power signal is registered by bucket detector 414. According to some embodiments, computational module 406 may be configured to estimate the probed depth d taking into account measurement data associated with non-maximum power values. That is, measurement data obtained when light rays 445 converge (i.e. are focused) before screen 434, or were to converge after screen 434 had screen 434 not been present. When this is the case, a greater percentage of the focused light is blocked (by screen 434) as compared to when the light rays substantially converge at aperture 440.

According to some such embodiments, computational module 406 may be configured to estimate the probed depth based on, or also on, the rate of change of the power (registered by bucket detector 414) as a function of the distance u (i.e. the distance between focusing lens 432 and screen 434), or, more generally, any other property, which may be extracted from a plot of the power versus the distance u. In particular, as shown below in the Results of simulations subsection, the rate of change of the power (as a function of the distance u) may decrease as the probed depth d is increased.

According to some embodiments, computational module 406 may have stored in the memory thereof software, which associates the shape of the plot of the power to the probed depth. In this regard, it is noted that machine-learning tools may be employed to correlate between the plot shape (i.e. the shape of the plot of the power) and the probed depth. The relation between the plot shape and the probed depth may depend on the profile of the inspection hole as well as the tilt angle of the incident e-beam.

The overall power of cathodoluminescent light arriving at focusing lens 432 (or, equivalently, the overall power of cathodoluminescent light arriving at collimating mirror 428 in embodiments including collimating mirror 428) may be obtained by integrating the registered power over the distance u.

According to some embodiments, additional information, beyond the probed depth, may be derivable from the overall power, and, more generally, the shape of the plot of the power as a function of the distance u. The additional information may include information characterizing the region around the inspection hole. In addition to the inspection hole, the region may include additional holes extending therethrough (or, equivalently, the electron cloud), e.g. holes that are nearest neighbors to the inspection hole, or holes that are nearest neighbors and next nearest neighbors holes to the inspection hole. According to some embodiments, additional information, which may be derived from the overall power, includes: (i) an average lateral extent of holes, extending through the region; (ii) the ratio of semiconductor material to air in the region when the sample is or includes a semiconductor structure, and/or (iii) the ratio of thickness of adjacent layers of different semiconductor materials, for example, when the sample is a 3D NAND memory (e.g. as depicted in FIG. 2A). According to some embodiments, the additional information may be taken into account in estimating the lateral extent of the tested hole at the probed depth.

Focal scanning unit 426, collimating mirror 428 (in embodiments wherein system 400 includes collimating mirror 428), and bucket detector 414 constitute, or form part of, a light sensing infrastructure (not numbered) of system 400, which corresponds to specific embodiments of light sensing infrastructure 104 of system 100. Collimating mirror 428, focusing lens 432, screen 434, and collimating lens 436 may form, or form part of, an optical module (not numbered) of system 400, which corresponds to specific embodiments of optical module 112 of system 100.

According to some embodiments, a stage 446, on which sample 401 is mounted, may be movable. In particular, the lateral position (i.e. the x and/or y coordinates) of stage 446 may be adjusted such that the lateral offset of e-beam 415 may be controllably set. In addition, stage 446 may be movable over larger distances so as to allow probing different holes in a sample. Additionally, or alternatively, according to some embodiments, a lateral position of e-beam source 402 may be adjusted, such as to allow controllably setting the lateral offset and/or probing different holes in a sample.

According to some embodiments, stage 446 may be rotatable. In particular, according to some embodiments, stage 446 may be rotatable so as to allow orienting stage 446 at each of a plurality of azimuthal angles, and thereby change the relative azimuthal angle between e-beam 415 and an inspection hole (e.g. inspection hole 405t). According to some embodiments, stage 446 may be rotated by 90°, 180°, and 270° (or −90°). Additionally, or alternatively, according to some embodiments, e-beam source 402 may be configured to allow changing the orientation of e-beam 415, such that the relative azimuthal angle between e-beam 415 and an inspection hole (e.g. inspection hole 405t) may be controllably set at each of a plurality of values.

According to some embodiments, e-beam source 402 may be configured to allow adjusting the orientation of e-beam 415, such that the polar angle between e-beam 415 may be controllably set at each of a plurality of values. By changing the polar angle, the depth inside an inspection hole—at which e-beam 415 is incident on the wall of the inspection hole—may be changed.

It is noted that the convergence point of light passed through focusing lens 432 may be offset (and "smeared") by vertically displacing sample 401. Thus, in addition to the distance u being adjustable, or alternatively thereto, according to some embodiments, stage 446 may be controllably movable along the vertical direction (i.e. in parallel to the z-axis).

According to some embodiments, not depicted in FIG. 4, collimating mirror 428 and focusing lens 432, system 400 may be replaced by a focusing mirror.

Figure 5:
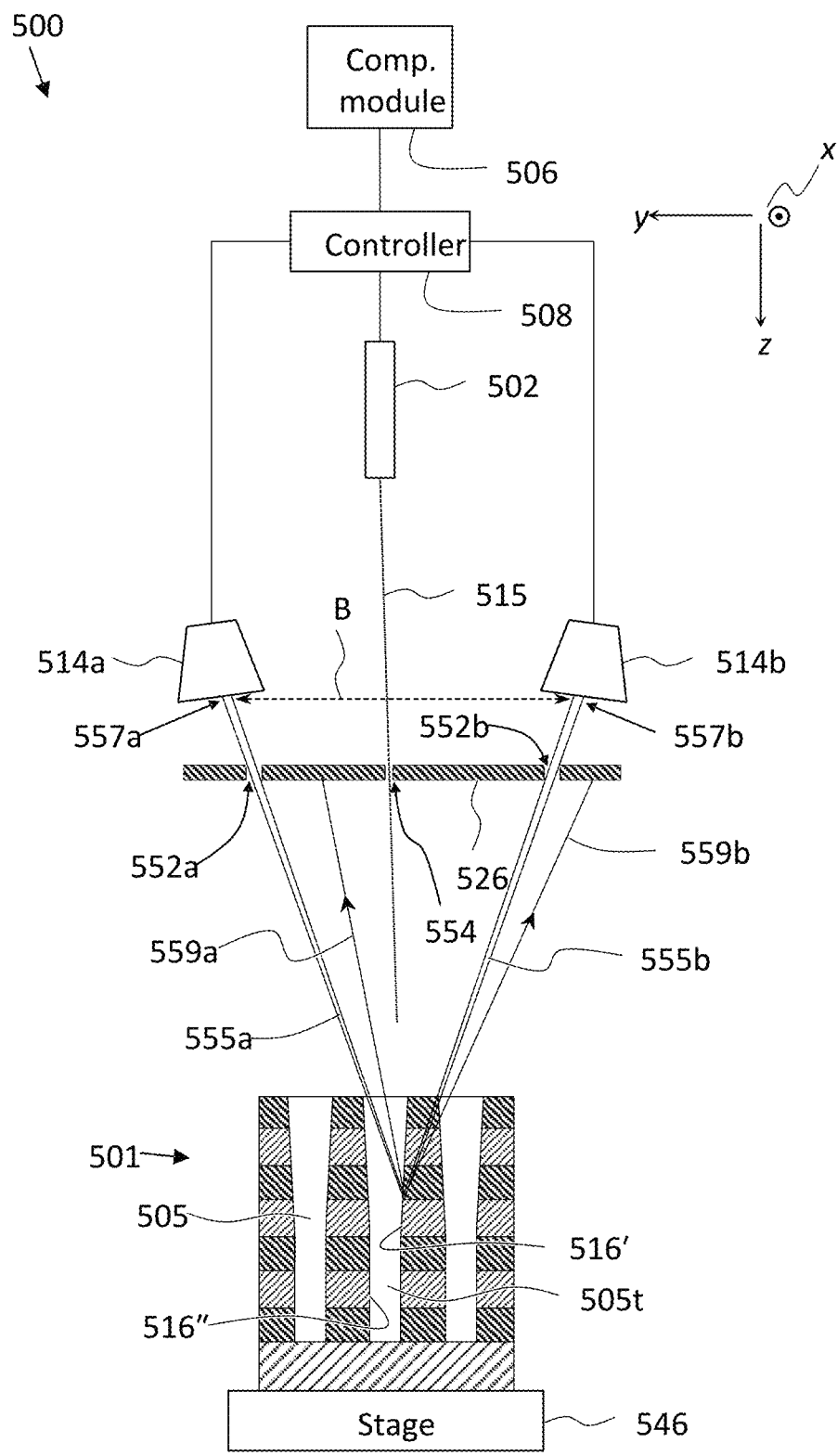
FIG. 5 schematically depicts a system for profiling holes in non-opaque samples and a sample probed by the system, the system corresponds to specific embodiments of the system of FIG. 1, which include a focal mask.

FIG. 5 is a block diagram of a system 500 for profiling holes in non-opaque samples, such as a sample 501, according to some embodiments. System 500 corresponds to specific embodiments of system 100, which include a focal mask 526. System 500 differs from system 400 at least in including focal mask 526 instead of a focal scanning unit. According to some embodiments, system 500 further differs from system 400 in including a pair of image sensors 514 (a first image sensor 514a, for example, a CMOS or CCD array, and a second image sensor 514b, for example, a CMOS or CCD array) instead of a bucket detector.

Sample 501 corresponds to specific embodiments of sample 101. (It is to be understood that sample 501 is not included in system 500.) Focal mask 526 constitutes, or forms part of, an optical module, which corresponds to specific embodiments of optical module 112 of system 100.

First image sensors 514a and second image sensor 514b (jointly) correspond to specific embodiments of light sensing module 114. In addition to focal mask 526, system 500 includes an e-beam source 502, a computational module 506, and a controller 508, which correspond to specific embodiments of e-beam source 102, computational module 106, and controller 108, respectively. System 500 may also include a stage 546 on which sample 501 may be mounted. According to some embodiments, stage 546 may be similar to stage 446.

An e-beam 515, generated by e-beam source 502, is shown impinging on a (first) wall 516' of an inspection hole 505t in sample 501. The impinging of e-beam 515 leads to the formation of a localized electron cloud (not shown)—within the bulk of sample 501—about a location (area) on the wall whereon e-beam 515 is incident.

According to some embodiments, system 500 may further include collection optics (not shown), such as, for example, a beam delimiter. The beam delimiter may be positioned between sample 501 and focal mask 526 and may be configured to narrow a light beam passing therethrough and generated in sample 501 (through cathodoluminescence).

As a non-limiting example and as depicted in FIG. 5, according to some embodiments, focal mask 526 is a Scheiner disc. In such embodiments, focal mask 526 includes a first hole 552a and a second hole 552b. Holes 552 may be positioned opposite to one another along a diameter of the Scheiner disc at equal distances from the center of the Scheiner disc. According to some embodiments, focal mask 526 may further include a third hole 554, wherethrough e-beam 515 may be directed towards sample 501. More generally, according to some embodiments, focal mask 526 may be a Hartmann mask.

Cathodoluminescent light generated by the electron cloud, and which travels in the direction of focal mask 526, is blocked by focal mask 526, except for a first light beam 555a and a second light beam 555b (and, potentially, according to some embodiments, wherein focal mask 526 includes third hole 554, cathodoluminescent light (not shown in FIG. 5) arriving at third hole 554). First light beam 555a and second light beam 555b are directed towards first hole 552a and second hole 552b, respectively, and pass therethrough. Cathodoluminescent light, passing through first hole 552a travels on towards first image sensor 514a and forms a spot 557a thereon. Cathodoluminescent light, passing through second hole 552b travels on towards second image sensor 514b and forms a spot 557b thereon. Light rays, such as a first light ray 559a and a second light ray 559b, are incident on focal mask 526 and are blocked thereby.

According to some embodiments, one or more lenses (not shown) may be positioned between first hole 552a and first image sensor 514a in order to focus first light beam 555a after emerging from first hole 552a. Similarly, according to some embodiments, one or more lenses (not shown) may be positioned between second hole 552b and second image sensor 514b in order to focus second light beam 555b after emerging from second hole 552b.

Also indicated is a distance B between spots 557a and 557b. Computational module 506 is configured to deduce the probed depth d (i.e. the depth at which e-beam 515 strikes a wall of inspection hole 505t) from the distance B. In particular, the greater the depth d, the smaller the distance B.

By translating stage 546 (and with it sample 501) in the direction of the negative y-axis, the probed depth d may be increased. To obtain a two-dimensional profile of inspection hole 505t, stage 501 may be rotated by 180°, and repositioned, so as to allow probing a second wall 516" of inspection hole 505t, which is opposite first wall 516'. To obtain a three-dimensional profile of inspection hole 505t, stage 546 may be rotated by 90°, and repositioned, so as to allow probing a third wall (not indicated) of inspection hole 505t, extending between first wall 516' and second wall 516", and, finally, rotated by 180°. And repositioned, so as to allow probing a fourth wall (not indicated) of inspection hole 505t, which is opposite to the third wall.

According to some embodiments, the distance between first hole 552a and second hole 552b is controllably adjustable.

According to some embodiments, not depicted in FIG. 5, system 500 may include a plurality of circularly-arranged, or substantially circularly-arranged, image sensors and a focal mask including a plurality of circularly-arranged, or substantially circularly-arranged, apertures. The plurality of apertures may include pairs of oppositely positioned apertures. Each image sensor may be so positioned such as to sense cathodoluminescent light filtered through a respective aperture. According to some such embodiments, computational module 506 is configured to deduce the probed depth d from the distances between spots on oppositely-positioned image sensors. Thus, if the plurality of image sensors includes n pairs of oppositely-positioned image sensors, computational module 506 may be configured to compute the probed depth d taking into account n distances $B_1$, $B_2$, . . . $B_n$, wherein $B_i$ is the distance between the two spots formed on the i-th pair of image sensors.

According to some alternative embodiments, instead of a plurality of oppositely positioned apertures, the focal mask may include a single annular-shaped slit, and, instead of a plurality of oppositely positioned image sensors, a single image sensor, having an annular-shaped photo-sensing surface, may be employed.

According to some embodiments, computational module 506 may be configured to take into account measurement data from a plurality of inspection holes in a sample in determining the profile of an inspection hole in the sample, essentially as described below in the Methods subsection and in the description of FIG. 8.

Figure 6:
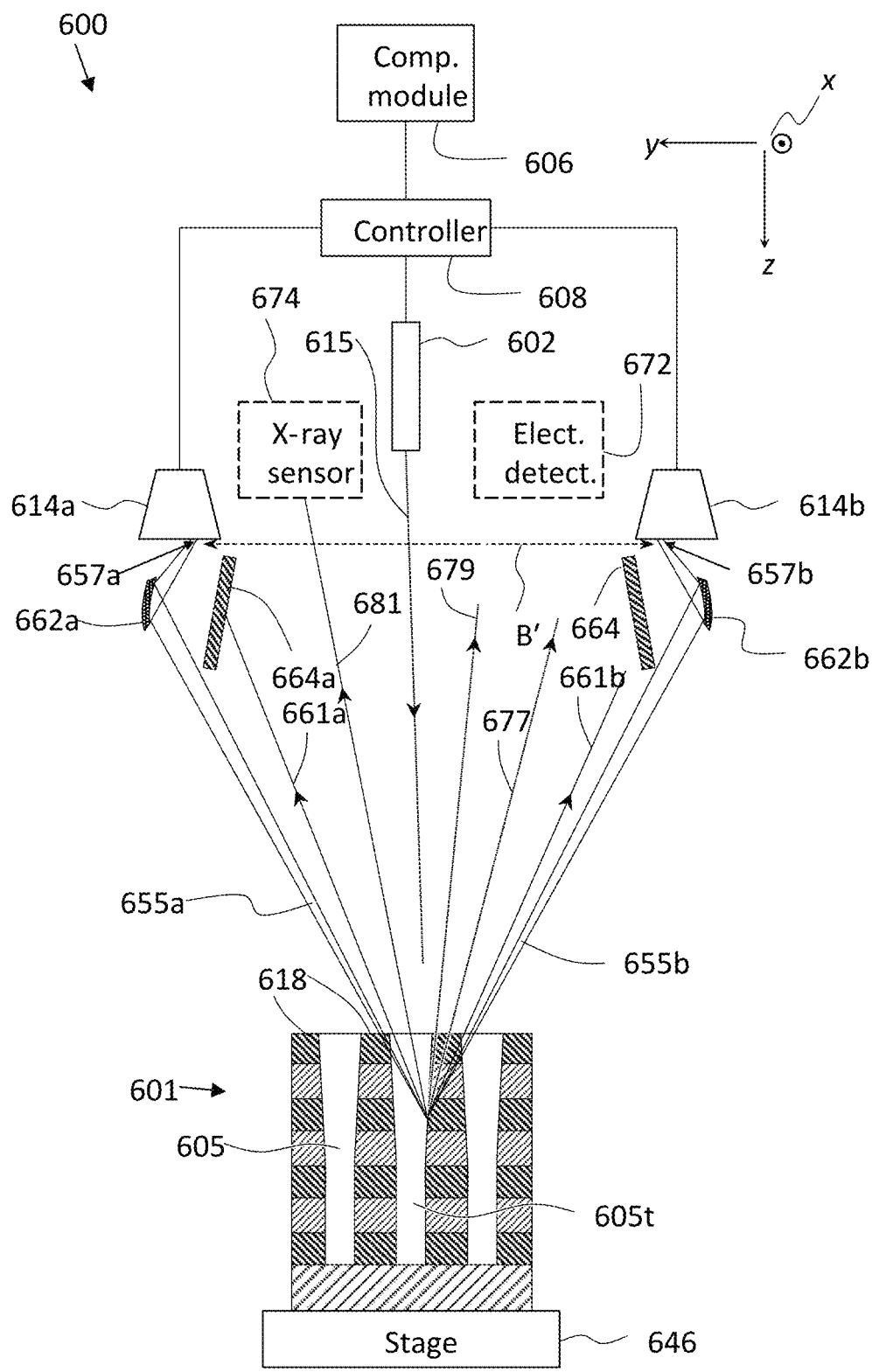
FIG. 6 schematically depicts a system for profiling holes in non-opaque samples and a sample probed by the system, the system corresponds to specific embodiments of the system of FIG. 1, which include a mirror arrangement.
Figure 7:
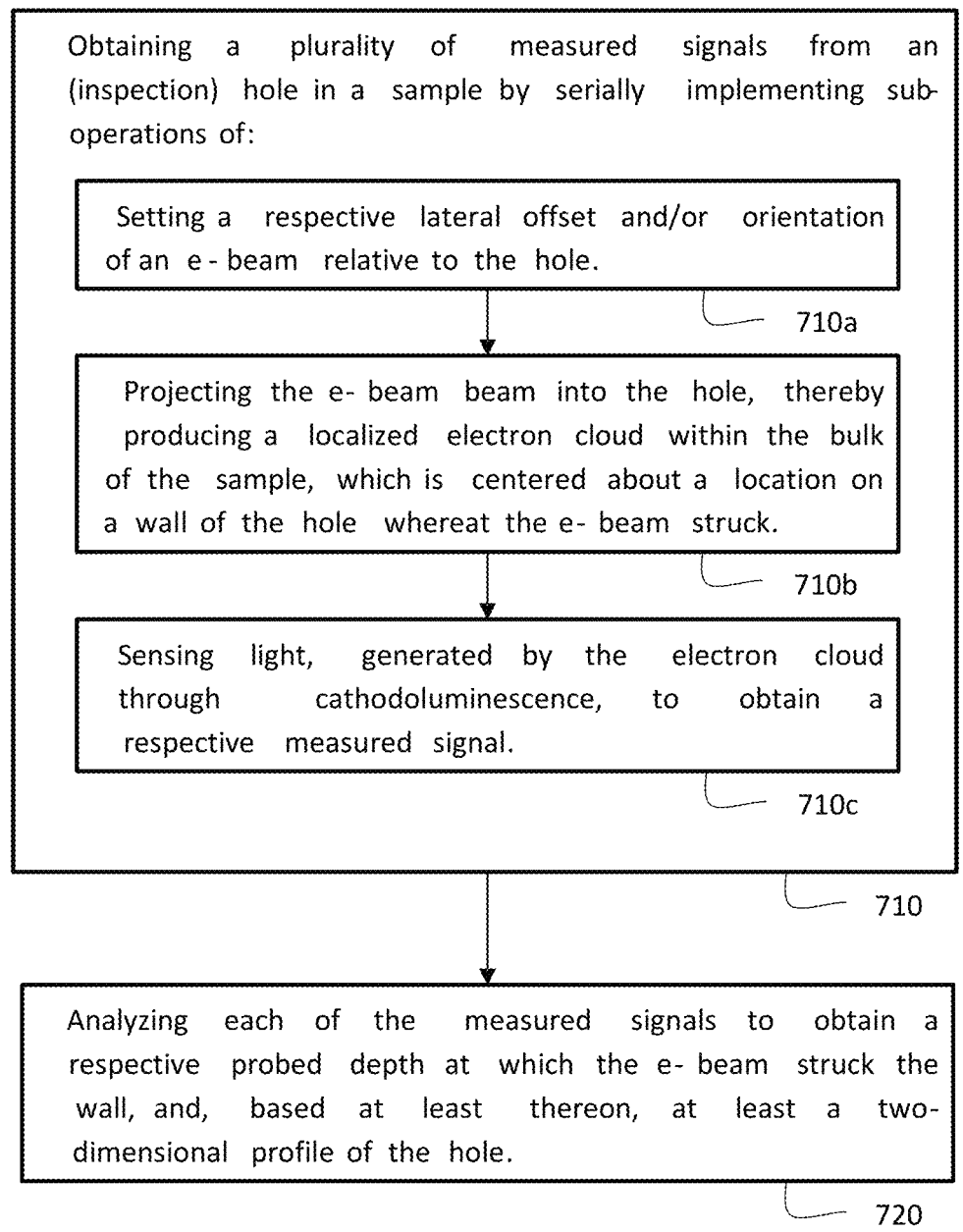
FIG. 7 is a flowchart of a method for profiling holes in non-opaque samples, according to some embodiments.

FIG. 6 is a block diagram of a system 600 for profiling holes in non-opaque samples, such as a sample 601, according to some embodiments. System 600 corresponds to specific embodiments of system 100. System 600 is similar to system 500 but may differ therefrom at least in including a mirror arrangement (e.g. an assembly of mirrors) 662 instead of a focal mask. Mirror arrangement 662 constitutes, or forms a part of, an optical module, which corresponds to specific embodiments of optical module 112 of system 100. More specifically, in addition to mirror arrangement 662, system 600 includes an e-beam source 602, a computational module 606, a controller 608, and a pair of image sensors 614, which are specific embodiments of e-beam source 102, computational module 106, controller 108, and light sensing module 114, respectively, and which may be similar to e-beam source 502, computational module 506, controller 508, and image sensors 514, respectively, of system 500. System 600 may also include a stage 646 on which sample 601 may be mounted. According to some embodiments, stage 646 may be similar to stage 546.

Sample 601 corresponds to specific embodiments of sample 101. (It is to be understood that sample 601 is not included in system 600.)

An e-beam 615, generated by e-beam source 602, is shown impinging on a wall of an inspection hole 605t in sample 601. The impinging of e-beam 615 leads to the formation of a localized electron cloud (not shown)—within the bulk of sample 601—centered about a location (area) on a wall of inspection hole 605t whereon e-beam 615 is incident.

According to some embodiments, mirror arrangement 662 includes two mirrors: a first mirror 662a and a second mirror 662b. First mirror 662a is positioned such that a first light beam 655a— constituting cathodoluminescent light generated by the electron cloud and directed towards first mirror 662a— is reflected from first mirror 662a onto a first image sensor 614a (of image sensors 614), such as to form a first spot 657a thereon. Second mirror 662b is positioned such that a second light beam 655b— constituting cathodoluminescent light generated by the electron cloud and directed towards second mirror 662b— is reflected from second mirror 662b onto second image sensor 614b (of image sensors 614), such as to form a second spot 657b thereon. According to some embodiments, first mirror 662a may be concave, such that cathodoluminescent light, reflected thereby, is focused onto first image sensor 614a. Similarly, according to some embodiments, second mirror 662b may be concave, such that cathodoluminescent light, reflected thereby, is focused onto second image sensor 614b.

According to some embodiments, system 600 further includes a first screen 664a and a second screen 664b. First screen 664a may be configured to block cathodoluminescent light (generated by the electron cloud; such as a light ray 661a) from directly arriving at first image sensor 614a, that is, without being reflected off of first mirror 662a. Put differently, first image sensor 614a may be positioned and dimensioned such as to block the cathodoluminescent light from reaching first image sensor 614a unless following an optical path that includes first mirror 662a. Similarly, second screen 664b may be configured to block cathodoluminescent light (generated by the electron cloud; such as a light ray 661b) from directly arriving at second image sensor 614b, that is, without being reflected off of second mirror 662b.

Also indicated is a distance B' between first spot 657a and second spot 657b. Computational module 606 is configured to deduce the probed depth d (i.e. the depth at which e-beam 615 strikes a wall of inspection hole 605t) from the distance B'.

By translating stage 646 (and with it sample 601) in the direction of the negative y-axis, the probed depth d may be increased. To obtain a two-dimensional profile of inspection hole 605t, stage 601 may be rotated by 180°, and repositioned, as described above in the description of FIG. 5. To obtain a three-dimensional profile of inspection hole 605t, stage 646 may be rotated and repositioned, as described above in the description of FIG. 5.

System 600 may include one or more additional sensors, such as one or more electron detectors and/or (additional) light sensors. According to some embodiments, and as depicted in FIG. 6, system 600 may include a pair of electron detectors 672 (not separately shown): A first electron detector (or BSE detector) may be a solid-state detector configured to sense backscattered electrons (schematically indicated by a dotted arrow 677) produced by elastic interactions between e-beam 615 and sample 601. A second electron detector may be an Everhart-Thornley (ET) detector configured to sense (comparatively lower energy) secondary electrons (schematically indicated by a dotted arrow 679) produced by inelastic interactions between e-beam 615 and sample 601.

According to some embodiments, and as depicted in FIG. 6, electron detectors 672 may be positioned between first image sensor 614a and second image sensor 614b. More specifically, according to some embodiments, if first image sensor 614a is mounted at $(y_1, x_1, z_1)$ and second image sensor 614b is mounted at $(y_2<y_1, x_2=x_1, z_2=z_1)$, then the BSE detector may be positioned at $(x_{BSE}, y_{BSE}, z_{BSE})$, wherein $y_2<y_{BSE}<y_1$. According to some such embodiments, $x_1-\Delta y/2<x_{BSE}<x_1+\Delta y/2$, wherein $\Delta y=|y_2-y_1|$. Similarly, the ET detector may be positioned at $(x_{ET}, y_{ET}, z_{ET})$, wherein $y_2<y_{ET}<y_1$. According to some such embodiments, $x_1-\Delta y/2<x_{ET}<x_1+\Delta y/2$. While in FIG. 6 electron detectors 672 are depicted as being positioned above (from the perspective of a reader perusing FIG. 6) image sensors 614 (so that $z_{BSE}<z_1$ and $z_{ET}<z_1$), according to some embodiments, electron detectors 672 may be positioned below (or at the same height as) image sensors 614.

Since the majority of backscattered electrons and secondary electrons, which escape sample 601—particularly, when sample 601 is a 3D NAND memory (as depicted in FIGS. 3A-3E), do so through a top surface 618 of sample 601, the above-specified positioning of electron detectors 672 may help ensure that strong signals may be quickly registered by electron detectors 672.

According to some embodiments, and as depicted in FIG. 6, system may include an X-ray sensor 674 (e.g. an energy/wavelength dispersive detector) configured to sense characteristic X-rays (a single X-ray is indicated in FIG. 6 by an arrow 681) generated by interaction between the electrons in e-beam 615 and sample 601. According to some embodiments, and as depicted in FIG. 6, X-ray sensor 674 is laterally mounted, or substantially laterally mounted, between first image sensor 614a and second image sensor 614b, essentially as described above with respect to electron detectors 672.

According to some embodiments, measurement data from electron detectors 672 and/or X-ray sensor 674 may be taken into account by computational module 606 in estimating the lateral extent of the inspection hole at the probed depth, and, more generally, the overall profile of the inspection hole.

Referring again to FIG. 5, according to some embodiments, the focal mask may be annular. That is, the focal mask may be shaped as a hollow disc characterized by an inner radius $r_1$ and an outer radius $r_2>r_1$. According to some such embodiments, system 500 may include one or more additional sensors—such as one or more electron detectors and/or an X-ray sensor—laterally positioned, or substantially laterally positioned, between first image sensor 514a and second image sensor 514b, optionally, above focal mask 526, essentially as described above with respect to electron detectors 672 and X-ray sensor 674 of system 600. In such embodiments, measurement data from the one or more additional sensors may be taken into account by computational module 506 in estimating the lateral extent of the inspection hole at the probed depth, and, more generally, the overall profile of the inspection hole, essentially as described above in the description of FIG. 6.

According to some embodiments, instead of a pair of diametrically opposite apertures, the focal mask may include an annular-shaped slit, characterized by a radius $r_s$ (such that $r_2>r_s>r_1$), and a plurality of circularly arranged image sensors or an annular shaped image sensor.

Methods

According to an aspect of some embodiments, there is provided a cathodoluminescence-based method 700 to probe holes in non-opaque samples, such as, for example, sample 101, 201, 301a, 301b, 301c, 301d, 301e, 401, 501, and 601. Method 700 may be implemented using system 100, as well as any one of the above-described specific embodiments thereof, i.e. system 400, system 500, and system 600. According to some embodiments, method 700 includes:

An operation 710 of obtaining a plurality of measured signals from an inspection hole (i.e. a hole which is inspected so as to obtain a profile thereof) in a (non-opaque) sample by serially implementing:

A sub-operation 710*a* of setting a respective lateral offset, and/or a respective orientation, of an e-beam relative to the inspection hole.

A sub-operation 710*b* of producing a localized electron cloud within the bulk the sample by impinging the e-beam on a wall (inner surface) of the inspection hole. The electron cloud is centered about a location struck (impinged on) by the e-beam on the wall of the inspection hole.

A sub-operation 710*c* of sensing light—generated by the electron cloud through cathodoluminescence—to obtain a respective measured signal.

An operation 720 of analyzing each measured signal to obtain (i) a respective probed depth—inside the sample—at which the respective e-beam struck the wall, and (ii) based at least on the obtained probed depths, at least a two-dimensional profile of the inspection hole or a probed section thereof.

According to some embodiments, the sample may be or include a semiconductor specimen. According to some such embodiments, the sample may be 3D NAND memory and the holes in the sample may be constituted by vias of the 3D NAND memory.

In each implementation of operation 710, the lateral offset and/or orientation (e.g. relative azimuthal angle) of the e-beam may be varied, so as to obtain information at least about a two-dimensional geometry on a vertical cross-section bisecting the inspection hole (along the full length of the inspection hole, or, if not probed to the full length thereof (i.e. to the bottom thereof), along a probed section of the inspection hole).

The lateral offset of the e-beam may be varied in increments, which depend on the spot size formed by the e-beam on the wall of the inspection hole, such that a required precision (profiling resolution) is attained. The smaller the increments, the greater the profiling resolution. A minimum spot size depends on the depth D of the inspection hole or on a maximum depth at which the inspection hole is probed by the e-beam (as well as on parameters of the e-beam (e.g. the width of the e-beam) and the landing energy).

According to some embodiments, the tilt angle θ of the e-beam (also referred to as the "polar angle") may be selected such that tan(θ) is smaller than about $$\frac{1}{D} \cdot \left( \langle \delta \rangle - \frac{w}{2} \right)$$

in order to likely ensure that the inspection hole may be probed to the bottom thereof. <δ> is the average radius of the inspection hole and w is the width of the e-beam.

According to some embodiments, the e-beam may be selected such that electrons therein have an average landing energy in the range of between about 1 keV and about 20 keV. According to some embodiments, the e-beam may be selected to have a current density in the range of between about 0.5 nA and about 1.2 nA.

According to some embodiments, one or more of the tilt angle of the e-beam, the (average) landing energy of the electrons in the e-beam, and the current density of the e-beam may be varied between different series of implementations, such that, for example, a top section of the inspection hole may be probed at a first tilt angle and/or first landing energy, a mid-section of the inspection hole may be probed at a second tilt angle and/or a second landing energy, and bottom section of the inspection hole may be probed at a third tilt angle and/or a third landing energy.

According to some embodiments, sub-operations 710*a* and 710*b* may be implemented utilizing an e-beam source, such as e-beam source 102. According to some embodiments, sub-operation 710*c* may be implemented utilizing a light sensing infrastructure, such as light sensing infrastructure 104. According to some embodiments, the light sensing infrastructure may include a focal scanning unit and a bucket detector, such as focal scanning unit 426 and bucket detector 414. According to some such embodiments, the measured signal may correspond to a peak power of light filtered through the focal scanning unit. According to some embodiments, a plurality of measured signals may be obtained by detecting light filtered through the focal scanning unit at effectively different foci thereof (e.g. by varying the distance between a focusing lens and an apertured screen of the focal scanning unit), as described above in the description of system 400. According to some such embodiments, wherein the foci are varied in small increments, a plot of power as a function of the effective focus may thus be obtained.

According to some embodiments, the light sensing infrastructure may include a focal mask, such as focal mask 526, and a light sensing module, such as (a light sensing module constituted by) first image sensor 514*a* and second image sensor 514*b*, in which case the measured signals may specify, or allow deriving, the positions of spots on the image sensors formed by light beams filtered through the focal mask (based on which, in operation 720, the probed depth d may be deduced). According to some such embodiments, the focal mask is a Scheiner disc and the measured signal may specify the distance between a pair of spots.

According to some embodiments, in operation 720, the probed depth may be deduced taking into account reference data (e.g. calibration data) associated with an expected hole profile and system settings and parameters (e.g. settings and parameters of system 100) utilized to implement operation 710. The reference data may relate each in a set of measured signals to a respective (probed) depth. According to some embodiments, the reference data may be in the form of a function, which, given a measured signal(s), outputs the probed depth. The form of the function may depend on the system settings and parameters (e.g. tilt angle, current density of the e-beam) utilized to implement operation 710. According to some embodiments, when reference data is not available for the system settings and parameters utilized, numerical fitting/extrapolation methods, and/or machine learning derived tools, may be utilized to estimate the probed depth, optionally, taking into account reference data corresponding to other system settings and parameters (e.g. closely matching system settings and parameters).

According to some embodiments, a lateral extent of the inspection hole at a given (e.g. deduced) probed depth d' may be obtained via the relation δ=$l_1$(d')+$l_2$(d')+tan(θ)·d', wherein, $l_1$(d') and $l_2$(d') are the lateral offsets of the e-beam along two opposite lateral directions, respectively, at the probed depth, and θ is the tilt angle of the e-beam.

According to some embodiments, to three-dimensionally profile an inspection hole, the inspection hole may be probed in at least three orientations (relative azimuthal angles), for example, four perpendicular, or substantially perpendicular, orientations (and at a plurality of lateral offsets per each orientation). The three-dimensional profile of the inspection hole may then be estimated from the obtained (deduced) probed depths at each of the orientations, using extrapolation and/or interpolation techniques.

As used herein, the terms "orientations" and "directions" may be used interchangeably.

According to some embodiments, method 700 may include an optional initial calibration operation, wherein reference data is generated. In particular, the calibration operation may be implemented when reference data for the expected profile (of the inspection hole) is not available: for example, when the expected profile represents a new design characterized by new dimensions. Reference data may be obtained by implementing operation 710 with respect to a hole(s) in a sample(s), which has been manufactured to have the expected profile (up to any manufacturing errors). Following the probing of the hole(s), the actual profile of the hole(s) may be obtained (i.e. evaluated to high accuracy) by slicing the sample(s), including the hole(s), into a plurality of sufficiently thin layers, whose "actual" structure is then obtained utilizing a scanning electron microscope (SEM) and/or a transmission electron microscope (TEM). Fitting software and/or machine learning software may then be employed to relate the raw measurement data—obtained in the implementation of operation 710—to the actual structure.

According to some embodiments, manufacturing anomalies may be averaged out by repeating the calibration operation with respect to a sufficiently large number of holes, located in different regions of a respective sample, on a sufficiently large number of samples from different batches.

According to some alternative embodiments, machine learning tools may be used to "extrapolate" the reference data based on existing reference data of a large number of holes of different designs.

According to some embodiments, method 700 is implemented with respect to a plurality of holes in a sample. That is, in such embodiments, method 700 may further include repetition thereof with respect to additional holes in the sample: Each inspection hole, or a section thereof (e.g. a top half of the hole, a bottom third of the hole, a midsection of the hole), may be fully probed (along at least two opposite directions), before proceeding to probe a next inspection hole. According to some such embodiments, the analysis of the measurement signals from the last inspection hole may be implemented simultaneously to the probing of the next inspection hole, or even prior thereto.

According to some alternative embodiments, operation 710 may be serially implemented with respect to the plurality of inspection holes before proceeding to operation 720. In operation 720, the measurement data from each of the plurality of inspection holes may be taken into account in estimating the profile of at least one of the inspection holes (in the plurality of inspection holes), for instance, the first inspection hole to have been probed. As a non-limiting example, according to some embodiments, the profile of each inspection hole may be estimated taking into account measurement data of holes adjacent to the inspection hole. According to some embodiments, in operation 720 measurement data from each of the plurality of inspection holes is taken into account in estimating the profiles of each of the plurality of holes.

According to some embodiments, the amount of memory consumed may be reduced by storing parameters characterizing an average profile of the inspection holes (in the plurality of inspection holes) instead of storing the individual profile of each inspection hole (in the plurality of inspection holes). According to some embodiments, this may allow expediting the scanning: Each inspection hole may be scanned for a comparatively shorter duration, since a lower profiling accuracy per (individual) inspection hole may suffice when the probing is restricted to the acquisition of average profiles.

According to some embodiments, rows of holes in a sample may be scanned in a first lateral direction, defined by the row (i.e. parallel to the row) and a second lateral direction opposite to the first direction, thereby allowing to obtain two-dimensional profiles of the holes in the row. According to some embodiments, the holes may additionally be scanned in a third direction, perpendicular to the row, and a fourth direction, opposite to the third direction, thereby allowing to obtain three-dimensional profiles of the holes.

According to some embodiments, sub-operation 710b may include obtaining additional measurement data associated with backscattered electrons, secondary electrons, characteristic X-rays, and/or an absorbed current. According to some embodiments, the additional measurement data may be taken into account, in operation 720, in estimating the lateral extent of the inspection hole at the probed depth, and, more generally, the overall profile of the inspection hole.

Figure 8:
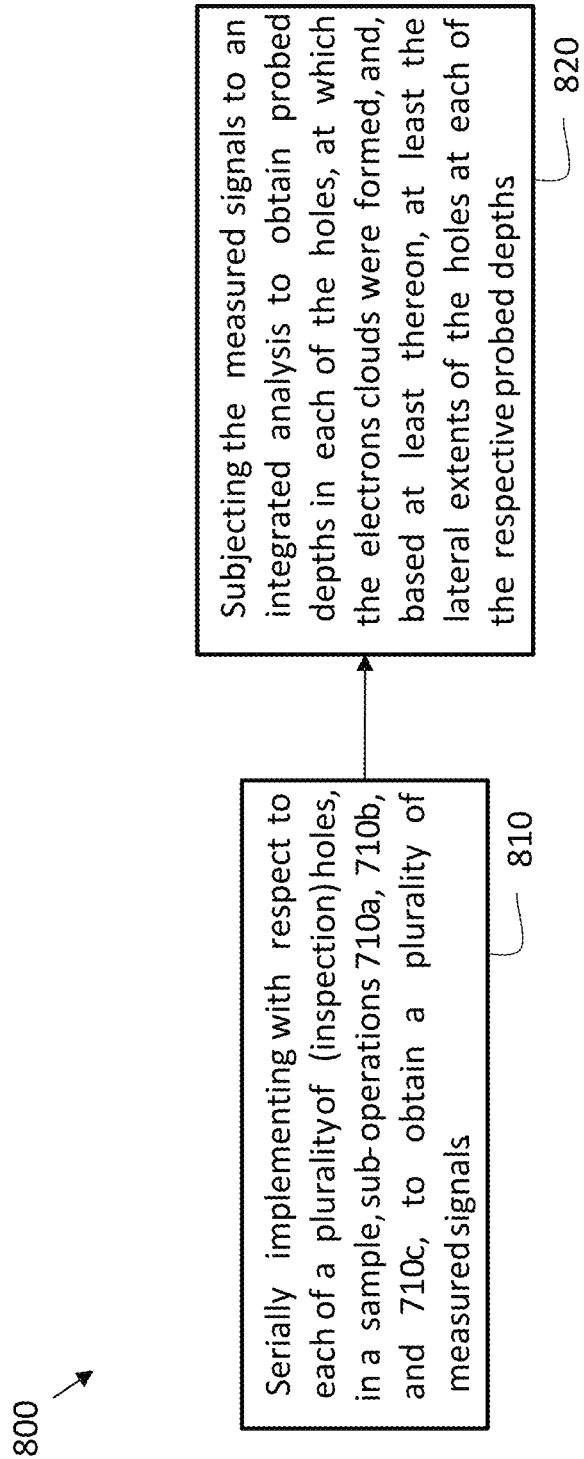
FIG. 8 is a flowchart of a method for profiling holes in non-opaque samples, which corresponds to specific embodiments of the method of FIG. 7.

FIG. 8 presents a flowchart of a method 800, wherein measurement data from a plurality of inspection holes is taken into account in deducing the profile of an inspection hole(s) in the plurality of inspection holes, according to some embodiments. Method 800 corresponds to specific embodiments of method 700. According to some embodiments, method 800 includes:

An operation 810, wherein sub-operations 710a, 710b, and 710c are serially implemented with respect to each in a plurality of inspection holes, in a sample, thereby obtaining a plurality of measured signals.

An operation 820, wherein the plurality of measured signals is subjected to an integrated analysis to obtain probed depths, at which the electron clouds were formed (within the sample) in each of the implementations, and, based at least thereon, lateral extents the inspection hole(s) at the obtained probed depths.

As a non-limiting example, according to some embodiments, operation 820 may (first) be implemented, once the inspection hole (or a first inspection hole), and each of the holes adjacent thereto, have all been probed, so that measurement data corresponding to each of the adjacent holes may additionally be taken into account in deducing the profile of the inspection hole. When profiles of two or more inspection holes are to be profiled, operation 820 may first be repeated once a second of the inspection holes, and each of the holes adjacent thereto, have all been probed, and so on.

Results of Simulations

Figure 9B:
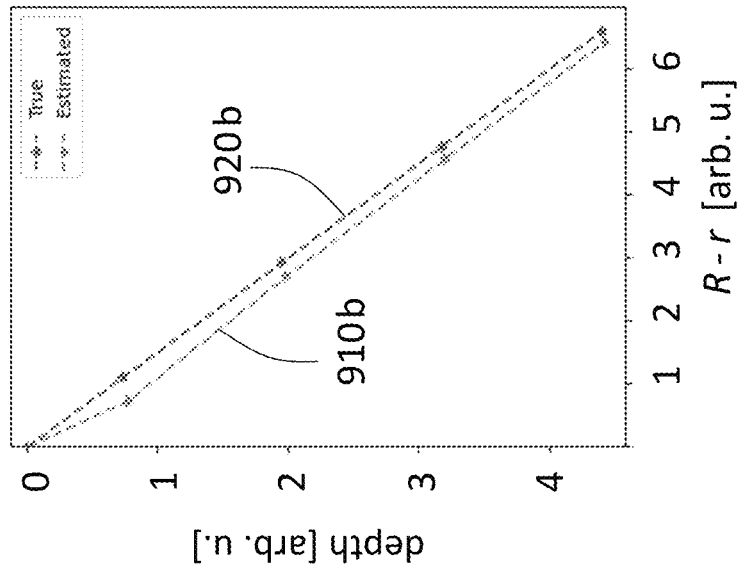
Figure 9A:
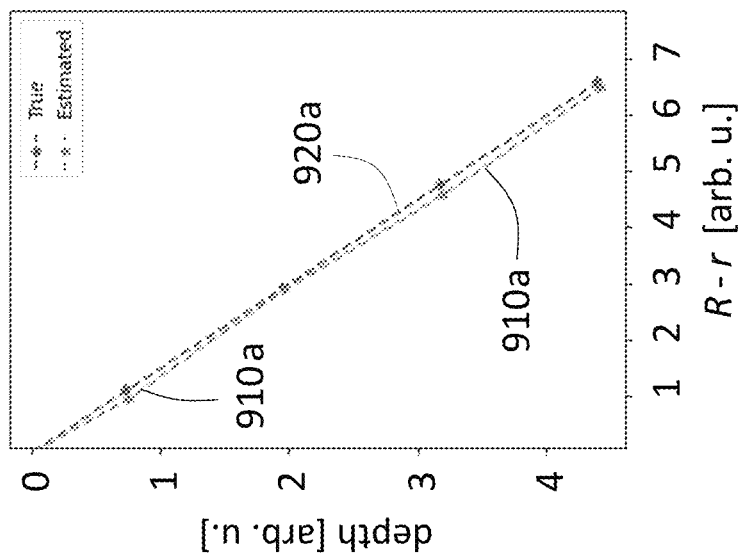
Figures 10A, 10B, 10C, 10D:
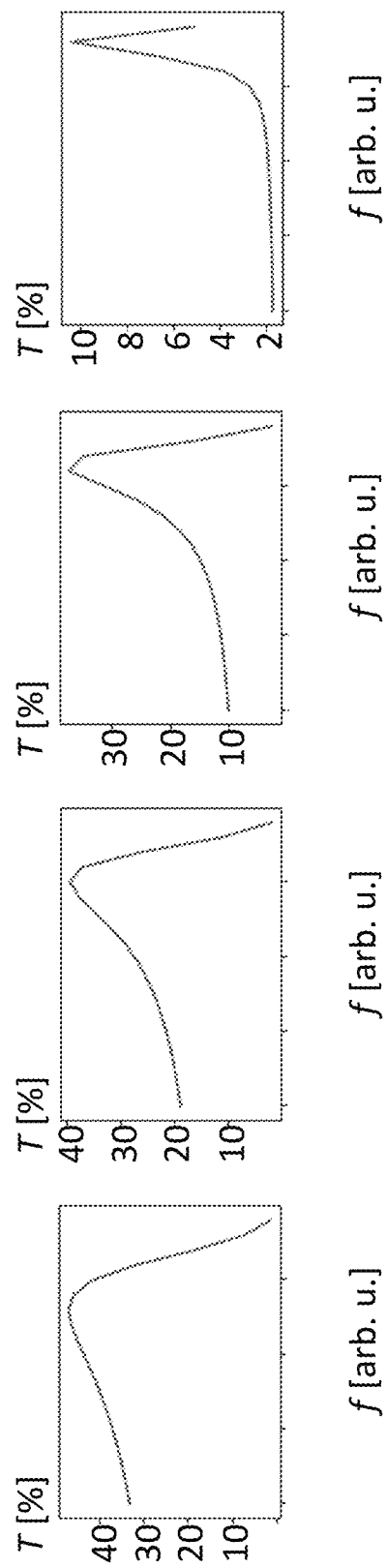

FIGS. 9A-10D present results of computer simulations modeling use of system 400 to profile holes. Referring to FIG. 9A, a plot 910a corresponds to an estimated profile of a sidewall of a (virtual) hole obtained at a first landing energy. Plot 920a corresponds to the actual (true) profile of the sidewall. Referring to FIG. 9B, a plot 910b corresponds to an estimated profile of the sidewall of the (virtual) hole obtained at a second landing energy, significantly greater than the first landing energy. Plot 920b corresponds to the actual (true) profile of the sidewall. In both FIGS. 9A and 9B, R denotes the radius of the hole at the entrance thereto, while r denotes to the radius at the probed depth. Thus, in each of the simulations, the radius of the hole decreases with the depth. In both simulations, the probed depth was taken as known (i.e. was not deduced). As can be seen, the estimated profiles closely match the actual profiles.

FIGS. 10A-10D present plots of transmission T (i.e. percentage) of cathodoluminescent light, through an aperture of a focal scanning unit, as function of the focal length f of the focusing lens thereof for four probed depths $d_A < d_B < d_C < d_D$, respectively. The different plots differ from one another markedly in shape. This suggests that shape of a plot contains extra information, beyond the location of the peak of a plot, or even the sharpness of the peak, which may be employed to increase the accuracy of the probed depth estimation, and consequently, the accuracy of the lateral extent estimation.

As used herein, the terms "electron beam" and "e-beam" are interchangeable.

As used herein, according to some embodiments, the term "inspection hole" may be used to distinguish a currently profiled, or about to be profiled, hole in a sample from the rest of the holes in the sample (which may or may not all be inspected). When no such distinction is necessary, a hole undergoing inspection, or about to undergo inspection, may be referred to simply as "hole" without the qualifier "inspection".

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. No feature described in the context of an embodiment is to be considered an essential feature of that embodiment, unless explicitly specified as such.

Although stages of methods according to some embodiments may be described in a specific sequence, methods of the disclosure may include some or all of the described stages carried out in a different order. A method of the disclosure may include a few of the stages described or all of the stages described. No particular stage in a disclosed method is to be considered an essential stage in that method, unless explicitly specified as such.

Although the disclosure is described in conjunction with specific embodiments thereof, it is evident that numerous alternatives, modifications, and variations that are apparent to those skilled in the art may exist. Accordingly, the disclosure embraces all such alternatives, modifications, and variations that fall within the scope of the appended claims. It is to be understood that the disclosure is not necessarily limited in its application to the details of construction and the arrangement of the components and/or methods set forth herein. Other embodiments may be practiced, and an embodiment may be carried out in various ways.

The phraseology and terminology employed herein are for descriptive purpose and should not be regarded as limiting. Citation or identification of any reference in this application shall not be construed as an admission that such reference is available as prior art to the disclosure. Section headings are used herein to ease understanding of the specification and should not be construed as necessarily limiting.

What is claimed is:

1. A system for profiling holes in non-opaque samples, the system comprising:
   an electron beam (e-beam) source configured to project an e-beam into an inspection hole in a sample, such that a wall of the inspection hole is impinged on and a localized electron cloud is produced inside a bulk of the sample;
   a light sensing infrastructure comprising and optical module and an light sensing module, the optical module configured to manipulate cathodoluminescent light generated by the electron cloud so as to allow obtaining from the transmitted light a probed depth d at which the wall of the inspection hole was impinged by the e-beam, and the light sensing module configured to obtain a measured signal of the transmitted light; and
   a computational module configured to analyze the measured signal to obtain the probed depth d;
   wherein a lateral offset, and/or orientation, of the e-beam is controllable, so as to allow generating localized electron clouds at each of a plurality of depths inside the sample, and thereby obtain information at least about a two-dimensional geometry of the inspection hole.

2. The system of claim 1, wherein the system is configured to controllably project the e-beam at any of a plurality of azimuthal angles, comprising two azimuthal angles (pi and $\varphi_2$ differing from one another by between about 150° and about 200°; and
   wherein the computational module is configured to extrapolate a lateral extent of the inspection hole along a cross-section of the inspection hole, defined by $\varphi_1$ and $\varphi_2$, as a function of the probed depth d, based on the lateral offsets thereat in the directions defined by $\varphi_1$ and $\varphi_2$.

3. The system of claim 1, wherein the optical module comprises a focal scanning unit configured to filter the cathodoluminescent light along an interval on an optical axis of the focal scanning unit, and wherein the light sensing module is a bucket detector.

4. The system of claim 1, wherein the optical module comprises a focal mask.

5. The system of claim 1, wherein the optical module comprises a plurality of mirrors arranged so as to produce a plurality of spots, respectively, on the light sensing module, and wherein the probed depth d is obtained based at least on one or more relative distances between pairs of spots from the plurality of spots.

6. The system of claim 1, further configured to allow orienting the e-beams, at a polar angle whose tangent is smaller than about $$\frac{1}{D} \cdot \left( \langle \delta \rangle - \frac{w}{2} \right),$$

wherein D is a depth of the inspection hole, $\langle \delta \rangle$ is an average diameter of the inspection hole, and w is a width of the e-beam, thereby allowing to probe the inspection hole to a bottom thereof.

7. The system of claim 6, further configured such that a relative azimuthal angle between the e-beam and a lateral axis of the inspection hole, is controllable, so as to allow generating localized electron clouds inside the inspection hole at each of a plurality of relative azimuthal angles and thereby obtain information about a three-dimensional geometry of the inspection hole.

8. The system of claim 7, further comprising a maneuverable stage, configured to have mounted thereon the sample, the maneuverable stage being rotatable, so as to allow probing the inspection hole at at least four azimuthal angles of 0°, about 90°, about 180°, and about 270°.

9. The system of claim 1, wherein the sample is a 3D NAND memory and holes in the sample, including the inspection hole, are vias.

10. The system of claim 1, further comprising one or more additional sensors selected from a backscattering electron detector, a secondary electron detector, an X-ray sensor, and an absorbed current detector, and, wherein, the computational module is configured to take into account measurement data, collected by the one or more additional sensors, in obtaining the probed depth d and/or the lateral extent of the inspection hole at the probed depth d.

11. A cathodoluminescence-based method to probe holes in a non-opaque sample, the method comprising:
    an operation of obtaining a plurality of measured signals from an inspection hole in a sample, which is non-opaque, by serially implementing sub-operations of:
        setting a respective lateral offset and/or a respective orientation of an electron beam (e-beam) relative to the inspection hole in the sample;
        producing a localized electron cloud within the sample by impinging the e-beam on a wall of the inspection hole; and
        sensing light generated, through cathodoluminescence, by the electron cloud, thereby obtaining a respective measured signal; and
    an operation of analyzing each of the plurality of measured signals to obtain: (i) per each measured signal, a respective probed depth d within the inspection hole at which the wall of the inspection hole was impinged, and (ii) based at least on the obtained probed depths, at least a two-dimensional profile of the inspection hole.

12. The method of claim 11, wherein the operation of obtaining the plurality of measured signals comprises implementing the sub-operations thereof at a plurality of azimuthal angles, comprising two azimuthal angles $\varphi_1$ and $\varphi_2$ differing from one another by between about 150° and about 200°; and
    wherein the operation of analyzing each of the plurality of measured signals further comprises extrapolating a lateral extent of the inspection hole along a cross-section of the inspection hole, defined by $\varphi_1$ and $\varphi_2$, as a function of the probed depth d, based on the lateral offsets thereat in the directions defined by $\varphi_1$ and $\varphi_2$.

13. The method of claim 11, wherein the measured signals are analyzed taking into account an expected profile of the inspection hole and/or reference data specifying expected values of the measured signals.

14. The method of claim 11, wherein the lateral offsets and/or orientations of the e-beams are varied between implementations, such that the electron clouds are produced at a plurality of probed depths inside the inspection hole.

15. The method of claim 11, wherein at least some of the e-beams are oriented at polar angle whose tangent is smaller than about $$\frac{1}{D} \cdot \left( \langle \delta \rangle - \frac{w}{2} \right),$$

wherein D is a depth of the inspection hole, $\langle \delta \rangle$ is an average diameter of the inspection hole, and w is a width of the e-beam, thereby allowing to probe the inspection hole to a bottom thereof.

16. The method of claim 11, wherein, per each probed depth, in the operations of producing the localized electron clouds, the e-beams are directed at a plurality of azimuthal angles, respectively, such that information about a three-dimensional geometry of the inspection hole is obtained.

17. The method of claim 11, wherein the sample is a 3D NAND memory and holes in the sample, including the inspection hole, are vias.

18. The method of claim 11, wherein focal scanning is utilized to obtain the value of d.

19. The method of claim 1, further comprising, when reference data for the expected profile of the inspection hole is unavailable, and, optionally, the expected profile of the inspection hole is not known, an initial calibration operation, wherein the reference data is generated by:
    (i) serially implementing the operation of producing the localized electron cloud and the operation of sensing the generated light to obtain a plurality of measured signals,
    (ii) slicing the sample and obtaining an actual structure of the inspection hole by utilizing a scanning or transmission electron microscope to profile each of the slices, and
    (iii) correlating the obtained measured signals to the obtained actual structure.

20. The method of claim 11, wherein each implementation further comprises sensing backscattered electrons and/or secondary electrons, and/or X-rays generated by interaction of between the e-beam and the sample, and, wherein, the probed depth d, and/or the lateral extent of the inspection hole at the probed depth d, is obtained further taking into account measurement data of the backscattered electrons and/or the secondary electrons, and/or the measurement data of the X-rays.

* * * * *